US012564053B2

(12) United States Patent
Bang et al.

(10) Patent No.: US 12,564,053 B2
(45) Date of Patent: Feb. 24, 2026

(54) SEMICONDUCTOR DEVICE AND METHOD OF MANUFACTURING THE SEMICONDUCTOR DEVICE

(71) Applicant: SK hynix Inc., Icheon-si (KR)

(72) Inventors: Byeong Chan Bang, Icheon-si (KR); Jin Taek Park, Icheon-si (KR); Jeong Yun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 668 days.

(21) Appl. No.: 17/531,060

(22) Filed: Nov. 19, 2021

(65) Prior Publication Data

US 2022/0399289 A1      Dec. 15, 2022

(30) Foreign Application Priority Data

Jun. 15, 2021      (KR) ........................ 10-2021-0077473

(51) Int. Cl.
| | |
|---|---|
| H01L 23/00 | (2006.01) |
| H01L 21/768 | (2006.01) |
| H10B 41/10 | (2023.01) |
| H10B 41/27 | (2023.01) |
| H10B 41/50 | (2023.01) |
| H10B 43/10 | (2023.01) |
| H10B 43/27 | (2023.01) |
| H10B 43/50 | (2023.01) |

(52) U.S. Cl.
CPC ...... *H01L 23/564* (2013.01); *H01L 21/76883* (2013.01); *H10B 41/50* (2023.02); *H10B 43/50* (2023.02); *H10B 41/10* (2023.02); *H10B 41/27* (2023.02); *H10B 43/10* (2023.02); *H10B 43/27* (2023.02)

(58) Field of Classification Search
CPC ............. H01L 23/564; H01L 21/76883; H01L 21/823475; H10B 41/50; H10B 41/10; H10B 41/27; H10B 43/50; H10B 43/10; H10B 43/27; H10D 84/0149
See application file for complete search history.

(56) References Cited

U.S. PATENT DOCUMENTS

| | | | |
|---|---|---|---|
| 9,881,929 B1 | 1/2018 | Ravikirthi et al. | |
| 2010/0133599 A1 | 6/2010 | Chae et al. | |
| 2015/0372101 A1 | 12/2015 | Lee et al. | |
| 2020/0027835 A1* | 1/2020 | Hsu ........................ | H10B 43/10 |
| 2020/0075618 A1* | 3/2020 | Oike ................ | H01L 21/76831 |

(Continued)

FOREIGN PATENT DOCUMENTS

| | | |
|---|---|---|
| CN | 109509756 A | 3/2019 |
| CN | 110246843 A | 9/2019 |

(Continued)

*Primary Examiner* — William B Partridge
*Assistant Examiner* — Linda J. Fleck
(74) *Attorney, Agent, or Firm* — WILLIAM PARK AND ASSOCIATES LTD.

(57) ABSTRACT

The present technology relates to a semiconductor device and a method of manufacturing the semiconductor device. The semiconductor device includes a stack structure including a plurality of interlayer insulating layers and a plurality of gate conductive layers that are alternately stacked, a channel plug at least partially passing through the stack structure on a cell region, and a plurality of support structures at least partially passing through the stack structure on a contact region.

13 Claims, 23 Drawing Sheets

(56)  References Cited

U.S. PATENT DOCUMENTS

| | | | | |
|---|---|---|---|---|
| 2020/0152585 | A1 | 5/2020 | Eom | |
| 2020/0219895 | A1* | 7/2020 | Mushiga | H10B 43/27 |
| 2020/0243498 | A1* | 7/2020 | Zhang | G11C 16/0483 |
| 2020/0350249 | A1 | 11/2020 | Kim et al. | |
| 2021/0090994 | A1* | 3/2021 | Noh | H10B 41/27 |
| 2021/0134832 | A1 | 5/2021 | Choi | |
| 2021/0351109 | A1* | 11/2021 | Sato | H10B 43/27 |
| 2021/0375904 | A1* | 12/2021 | Baek | H10B 43/50 |
| 2022/0139952 | A1* | 5/2022 | Kim | H10B 41/27 |
| | | | | 257/314 |
| 2022/0189988 | A1* | 6/2022 | Kang | H01L 24/80 |
| 2023/0084615 | A1* | 3/2023 | Xie | H01L 23/562 |
| | | | | 257/314 |
| 2024/0088021 | A1* | 3/2024 | Noh | H10B 43/35 |
| 2024/0282695 | A1* | 8/2024 | Kim | H10B 43/40 |

FOREIGN PATENT DOCUMENTS

| | | | |
|---|---|---|---|
| CN | 111211132 | A | 5/2020 |
| CN | 111952313 | A | 11/2020 |
| CN | 112563279 | A | 3/2021 |
| CN | 112701126 | A | 4/2021 |
| KR | 1020200053919 | A | 5/2020 |
| KR | 1020210036134 | A | 4/2021 |

* cited by examiner

SEMICONDUCTOR DEVICE AND METHOD OF MANUFACTURING THE SEMICONDUCTOR DEVICE

CROSS-REFERENCE TO RELATED APPLICATION

The present application claims priority under 35 U.S.C. § 119(a) to Korean patent application number 10-2021-0077473, filed on Jun. 15, 2021, which is incorporated herein by reference in its entirety.

BACKGROUND

1. Technical Field

The present disclosure relates to an electronic device, and more particularly, to a semiconductor device and a method of manufacturing the semiconductor device.

2. Related Art

A nonvolatile memory element is a memory element in which stored data is maintained even though power supply is cut off. Recently, as improvement of an integration degree of a two-dimensional nonvolatile memory element that forms a memory cell in a single layer on a substrate has reached a limit, a three-dimensional nonvolatile memory element that vertically stacks memory cells on a substrate has been proposed.

The three-dimensional nonvolatile memory element includes interlayer insulating layers and gate electrodes which are alternately stacked, and channel layers passing through the interlayer insulating layers and the gate electrodes, and memory cells are stacked along the channel layers. Various structures and manufacturing methods have been developed to improve reliability of the nonvolatile memory element having such a three-dimensional structure.

SUMMARY

According to an embodiment of the present disclosure, a semiconductor device may include a stack structure including a plurality of interlayer insulating layers and a plurality of gate conductive layers that are alternately stacked, a channel plug at least partially passing through the stack structure on a cell region, and a plurality of support structures at least partially passing through the stack structure on a contact region. The plurality of support structures include a first support structure of a line type and a second support structure of a hole type.

According to an embodiment of the present disclosure, a semiconductor device may include a stack structure including a plurality of interlayer insulating layers and a plurality of gate conductive layers that are alternately stacked, first and second channel plugs formed on a cell region by vertically passing through a portion or an entirety of the stack structure, a plurality of support structures formed on a contact region by vertically passing through a portion or an entirety of the stack structure, and an auxiliary support structure disposed on the stack structure and the plurality of support structures.

According to an embodiment of the present disclosure, a method of manufacturing a semiconductor device may include forming a stack structure in which a plurality of interlayer insulating layers and a plurality of sacrificial layers are alternately stacked on a substrate including a cell region and a contact region, etching the stack structure on the contact region to form first holes for forming a contact plug passing through a portion or an entirety of the stack structure, trenches for forming a first support structure, and second holes for forming a second support structure together, forming contact plugs by filling the first holes with a barrier layer and a conductive layer for a gate, forming an auxiliary support structure including a plurality of open regions overlapping a portion of the trenches and a portion of the second holes on the stack structure, removing the barrier layer and the conductive layer for the gate remaining in the trenches and the second holes exposed through the plurality of open regions of the auxiliary support structure, and forming the first support structures and the second support structures by filling the trenches and the second holes with an insulating layer.

BRIEF DESCRIPTION OF THE DRAWINGS

FIGS. 3A, 3B, 3C, and 3D are plan and cross-sectional views of a semiconductor device according to an embodiment of the present disclosure.

FIGS. 4, 5A, 5B, 6A, 6B, 7, 8A, 8B, 9, 10A, 10B, and 11 are cross-sectional and plan views illustrating a method of manufacturing a semiconductor device according to an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Hereinafter, embodiments of the present disclosure will be described in detail with reference to the accompanying drawings.

An embodiment of the present disclosure provides a semiconductor device having a stable structure and an improved characteristic, and a method of manufacturing the semiconductor device.

According to the present technology, a semiconductor device having a stable structure may be manufactured, and thus a characteristic of the semiconductor device may be improved.

Figure 1A:
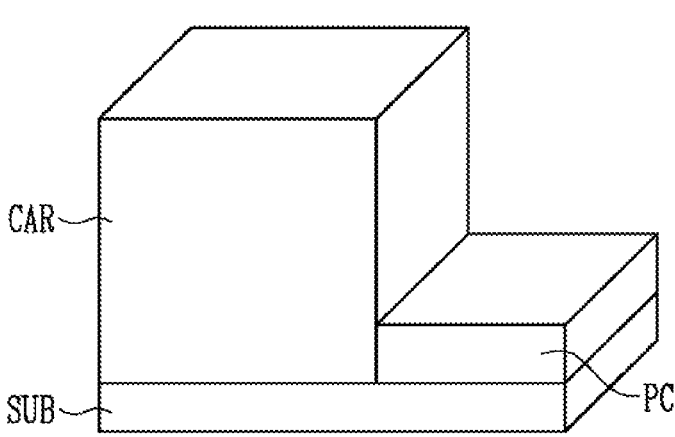
FIGS. 1A and 1B are block diagrams schematically illustrating semiconductor devices according to embodiments of the present disclosure.
Figure 1B:
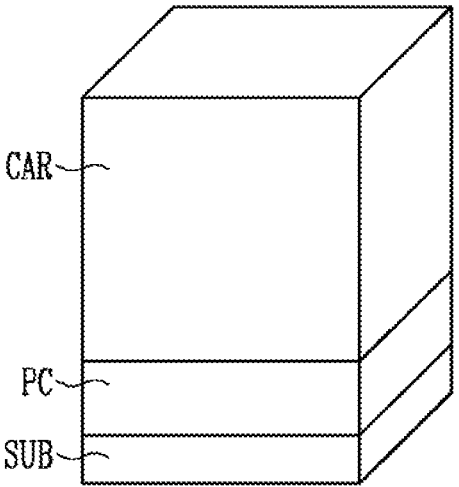

FIGS. 1A and 1B are block diagrams schematically illustrating semiconductor devices according to embodiments of the present disclosure.

Referring to FIGS. 1A and 1B, each of the semiconductor devices according to embodiments of the present disclosure may include a peripheral circuit structure PC and a cell array CAR disposed on a substrate SUB.

The substrate SUB may be a single crystal semiconductor layer. For example, the substrate SUB may be a bulk silicon substrate, a silicon on insulator substrate, a germanium substrate, a germanium on insulator substrate, a silicon-germanium substrate, or an epitaxial thin layer formed through a selective epitaxial growth method.

The cell array CAR may include a plurality of memory blocks, Each of the memory blocks may include a plurality of cell strings. Each of the cell strings is electrically connected to a bit line, a source line, word lines, and select lines, Each of the cell strings may include memory cells and select transistors connected in series. Each of the select lines is used as a gate electrode of a select transistor corresponding thereto, and each of the word lines is used as a gate electrode of a memory cell corresponding thereto.

The peripheral circuit structure PC may include NMOS transistors and PMOS transistors electrically connected to the cell array CAR, a resistor, and a capacitor. The NMOS and PMOS transistors, the resistor, and the capacitor may be used as elements configuring a row decoder, a column decoder, a page buffer, and a control circuit.

As shown in FIG. 1A, the peripheral circuit structure PC may be disposed on a partial region of the substrate SUB, which does not overlap the cell array CAR.

Alternatively, as shown in FIG. 1B, the peripheral circuit structure PC may be disposed between the cell array CAR and the substrate SUB. In this case, since the peripheral circuit structure PC overlaps the cell array CAR, the area of the substrate SUB occupied by the cell array CAR and the peripheral circuit structure PC may be reduced.

Figure 2:
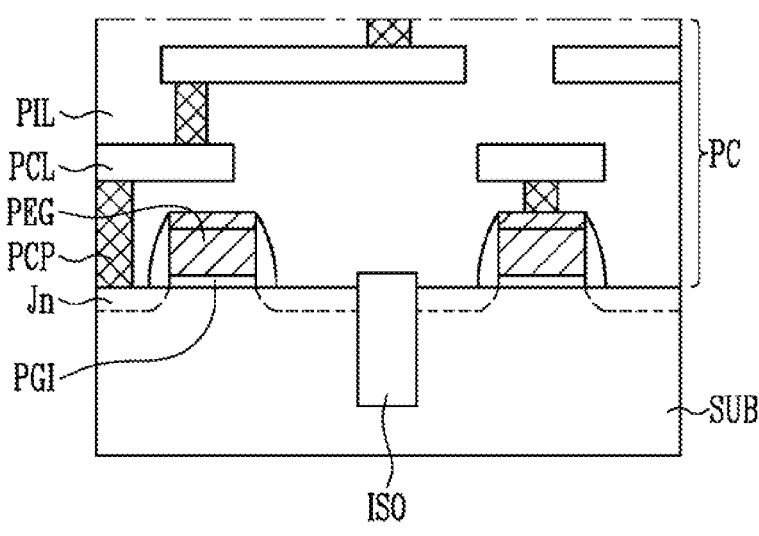
FIG. 2 is a cross-sectional view schematically illustrating a peripheral circuit structure.

FIG. 2 is a cross-sectional view schematically illustrating a peripheral circuit structure.

The peripheral circuit structure PC shown in FIG. 2 may be included in the peripheral circuit structure shown in FIG. 1A or may be included in the peripheral circuit structure shown in FIG. 1B.

Referring to FIG. 2, the peripheral circuit structure PC may include peripheral gate electrodes PEG, a peripheral gate insulating layer PGI, junctions Jn, peripheral circuit lines PCL, and peripheral contact plugs PCP. The peripheral circuit structure PC may be covered with a peripheral circuit insulating layer PIL formed on the substrate SUB.

Each of the peripheral gate electrodes PEG may be used as gate electrodes of the NMOS transistor and a PMOS transistor of the peripheral circuit structure PC. The peripheral gate insulating layer PGI is disposed between each of the peripheral gate electrodes PEG and the substrate SUB.

The junctions in are regions defined by implanting an n-type or p-type impurity into an active region of the substrate SUB, are disposed on both sides of each of the peripheral gate electrodes PEG, and are used as a source junction or a drain junction. The active region of the substrate SUB may be partitioned by an isolation layer ISO formed in the substrate SUB. The isolation layer ISO is formed of an insulating material.

The peripheral circuit lines PCL may be electrically connected to the transistors, the resistor, and the capacitor configuring a circuit of the peripheral circuit structure PC through the peripheral contact plugs PCP.

The peripheral circuit insulating layer PIL may include insulating layers stacked in multiple layers.

FIGS. 3A to 3D are plan and cross-sectional views of a semiconductor device according to an embodiment of the present disclosure.

Figure 3A:
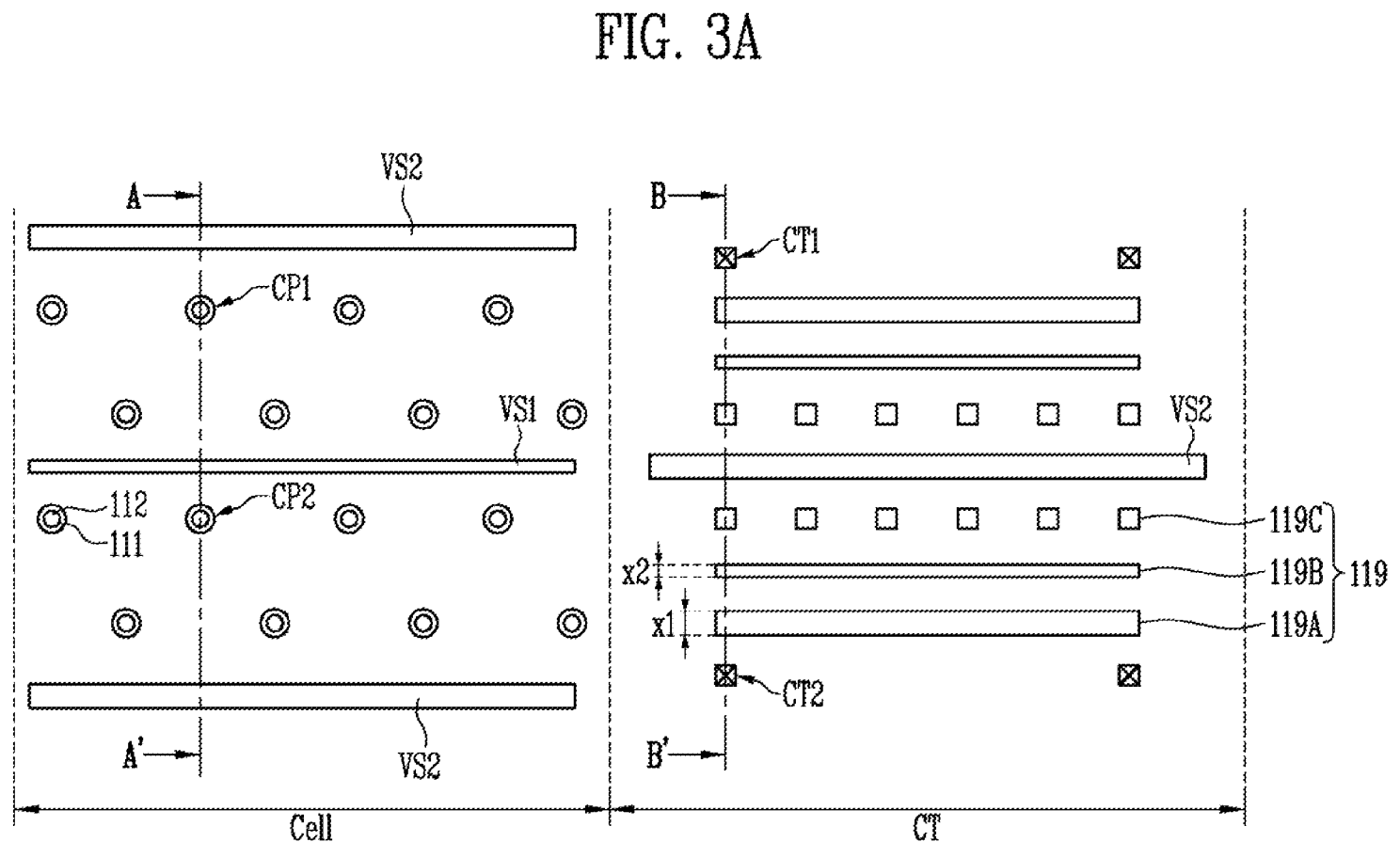

Referring to FIG. 3A, the cell array CAR of FIGS. 1A and 1B of the semiconductor device may include a cell region Cell and a contact region CT. A plurality of channel plugs CP1 and CP2 may be regularly arranged on the cell region Cell. In addition, a first vertical structure VS1 of a line shape disposed between the plurality of channel plugs CP1 and CP2 may be arranged in a central portion of the cell region Cell, and a second vertical structure VS2 may be disposed at both ends of the cell region Cell. The plurality of channel plugs CP1 and CP2 may be arranged between the second vertical structures VS2. Each of the plurality of channel plugs CP1 and CP2 may include a channel layer 112 and a memory layer 111 surrounding the channel layer 112. The first vertical structure VS1 and the second vertical structure VS2 may be an Insulating layer, and may be formed of, for example, an oxide layer.

A plurality of contact plugs CT1 and CT2 may be regularly arranged on the contact region CT. In addition, at least one support structure 119 and the second vertical structure VS2 may be arranged in a space between the plurality of contact plugs CT1 and CT2 on the contact region CT. The support structure 119 may be formed of the same material as the first vertical structure VS1. The support structure 119 may be an insulating layer, and may be formed of, for example, an oxide layer. The support structure 119 may include a first support structure 119A and a second support structure 119B of a line type, and a third support structure 119C of a hole type. A width X1 of the first support structure 119A may be wider than a width X2 of the second support structure 119B. That is, the support structure 119 may include the support structures of the line type and the support structures of the hole type having different widths. The first support structure 119A and the second support structure 119B of the line type and the third support structure 119C of the hole type are disposed to be parallel to the second vertical structure VS2 and do not intersect and overlap each other.

Figure 3B:
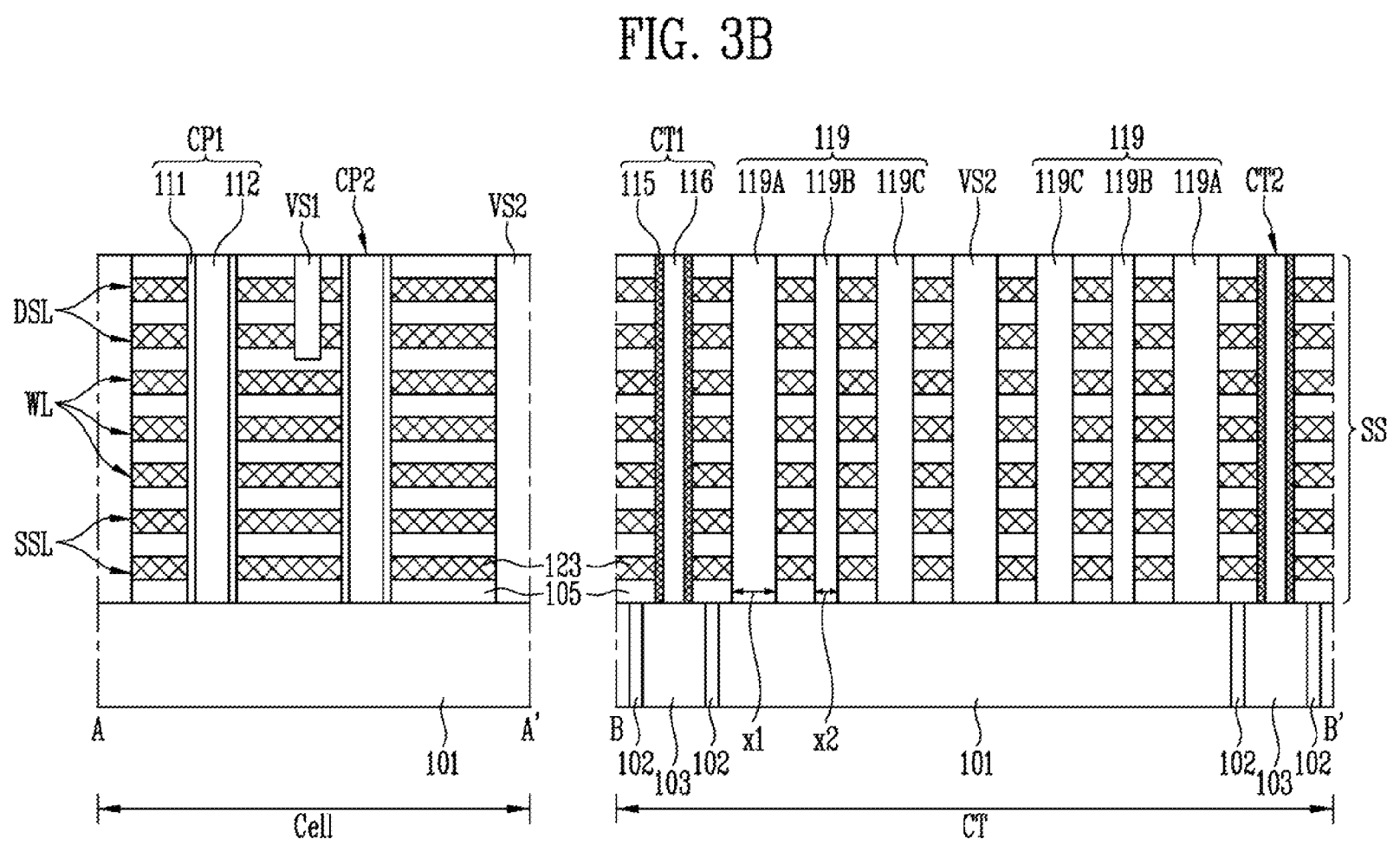

Referring to FIG. 3B, a cross-section A-A' is a cross-section of the cell region, and a cross-section B-B' is a cross-section of the contact region CT.

On the cell region Cell of the semiconductor device, a source line layer 101, a stack structure SS stacked on the source line layer 101, the channel plugs CP1 and CP2 contacting the source line layer 101 by passing through a portion or an entirety of the stack structure SS in a vertical direction, the second vertical structures VS2 vertically disposed on both ends of the stack structure SS and contacting the source line layer 101, and the first vertical structure VS1 disposed by passing through a portion of the stack structure SS disposed between the channel plugs CP1 and CP2 may be included and configured.

The source line layer 101 may be a doped semiconductor layer. For example, the source line layer 101 may be a semiconductor layer doped with an n-type impurity. As an embodiment, the source line layer 101 may be formed by implanting an impurity into a surface of the substrate SUB shown in FIG. 1A, or may be formed by depositing at least one doped silicon layer on the substrate SUB. As an embodiment, the source line layer 101 may be formed by forming an insulating layer on the peripheral circuit structure PC shown in FIG. 1B and then depositing at least one doped silicon layer on the insulating layer.

The stack structure SS may include a structure in which a plurality of gate conductive layers 123 and interlayer insulating layers 105 are alternately stacked, and, in some embodiments, have a structure in which the interlayer insulating layer 105 is disposed at the lowermost end and the uppermost end of the stack structure SS. At least one gate conductive layer disposed at the lowermost end of the gate conductive layers 123 may be a source select line SSL, at least one gate conductive layer disposed at the uppermost end of the gate conductive layers 123 is a drain select line DSL, and the remaining gate conductive layers may be word lines WL.

The channel plugs CP1 and CP2 may be vertically arranged by passing through the stack structure SS, and may include a channel layer 112 and a memory layer 111 surrounding the channel layer 112.

The first vertical structure VS1 may be disposed to pass through the at least one gate conductive layer 123 that is used as the drain select line DSL and disposed at the uppermost portion of the stack structure SS disposed between the channel plugs CP1 and CP2. That is, the first vertical structure VS1 electrically separates the gate conductive layer 123 for the drain select line DSL connected to the first channel plug CP1 and the gate conductive layer 123 for the drain select line DSL connected to the second channel plug CP2.

On the contact region CT of the semiconductor device, the source line layer 101, a contact pad layer 103, an isolation layer 102 disposed between the source line layer 101 and the contact pad layer 103, the stack structure SS stacked on the isolation layer 102 and the contact pad layer 103, the contact plugs CT1 and CT2 contacting the contact pad layer 103 by passing through a portion or an entirety of the stack structure SS in the vertical direction, the second vertical structure VS2 contacting the source line layer 101 by passing through a portion or an entirety of the stack structure SS in the vertical direction, and at least one support structure 119 may be included and configured.

The source line layer 101 and the contact pad layer 103 are formed on the same layer, and the source line layer 101 and the contact pad layer 103 are electrically separated from each other by the isolation layer 102 disposed between the source line layer 101 and the contact pad layers 103. The isolation layer 102 may be formed of an insulating layer, for example, an oxide layer. The contact pad layer 103 may be electrically connected to the peripheral circuit structure PC shown in FIGS. 1A and 1B.

Each of the contact plugs CT1 and CT2 may include a conductive layer 116 for a contact plug and a barrier layer 115 surrounding the conductive layer 116 for the contact plug. The barrier layer 115 may also be formed on a sidewall of the support structures 119.

Figure 3C:
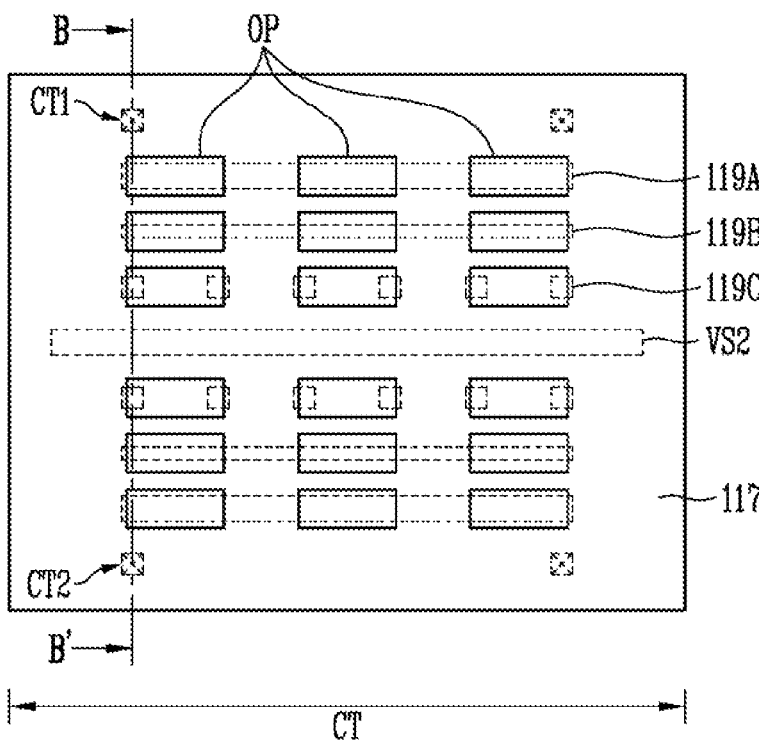
Figure 3D:
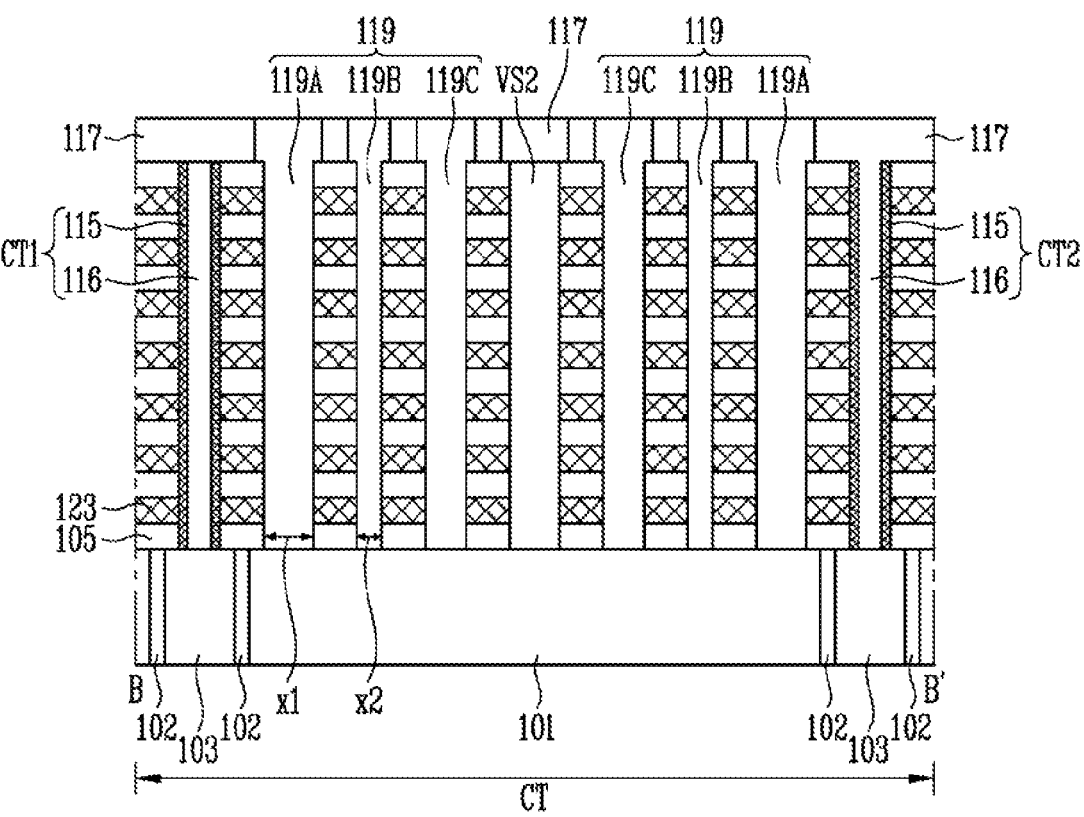

FIGS. 3C and 3D are plan and cross-sectional views of the semiconductor device illustrating a structure in which an auxiliary support structure 117 is disposed on the stack structure SS of the contact region CT of the semiconductor device shown in FIGS. 3A and 3B described above.

Referring to FIGS. 3C and 3D, the auxiliary support structure 117 may be disposed on the stack structure SS and the support structure 119 formed in the contact region CT of the semiconductor device. The auxiliary support structure 117 may have a plurality of open regions OP, and plurality of open regions OP may overlap the support structure 119. For example, the plurality of open regions OP may be disposed to overlap the first support structure 119A, the second support structure 119B, and the third support structures 119C. The plurality of open regions OP may have a dash type. The auxiliary support structure 117 may be formed in a mesh structure. The plurality of open regions OP may be disposed in a matrix structure. At least one open region OP among the plurality of open regions OP may be disposed to overlap the first support structure 119A. At least one open region OP among the plurality of open regions OP may be disposed to overlap the second support structure 119B. At least one third support structure 119C among the plurality of third support structures 119C may overlap one open region OP. That is, at least one third support structure 119C may overlap one open region OP.

The auxiliary support structure 117 may include the same material as a mask pattern for forming the first vertical structure VS1 of FIGS. 3A and 3B formed on the cell region of the semiconductor device.

In the semiconductor device according to an embodiment of the present disclosure described above, the support structure 119 for supporting the stack structure SS may be disposed in the contact region CT, and the support structure 119 is formed of a structure of a line type and a hole type. Therefore, in some embodiments, a problem in that the support structure 119 is expanded and tilted in one direction by heat generated during a subsequent process may be suppressed. In addition, in some embodiments, by forming the auxiliary support structure 117 on the support structure 119, an expansion of an upper portion of the support structure 119 may be suppressed.

FIGS. 4 to 11 are cross-sectional and plan views illustrating a method of manufacturing a semiconductor device according to an embodiment of the present disclosure.

Figure 4:
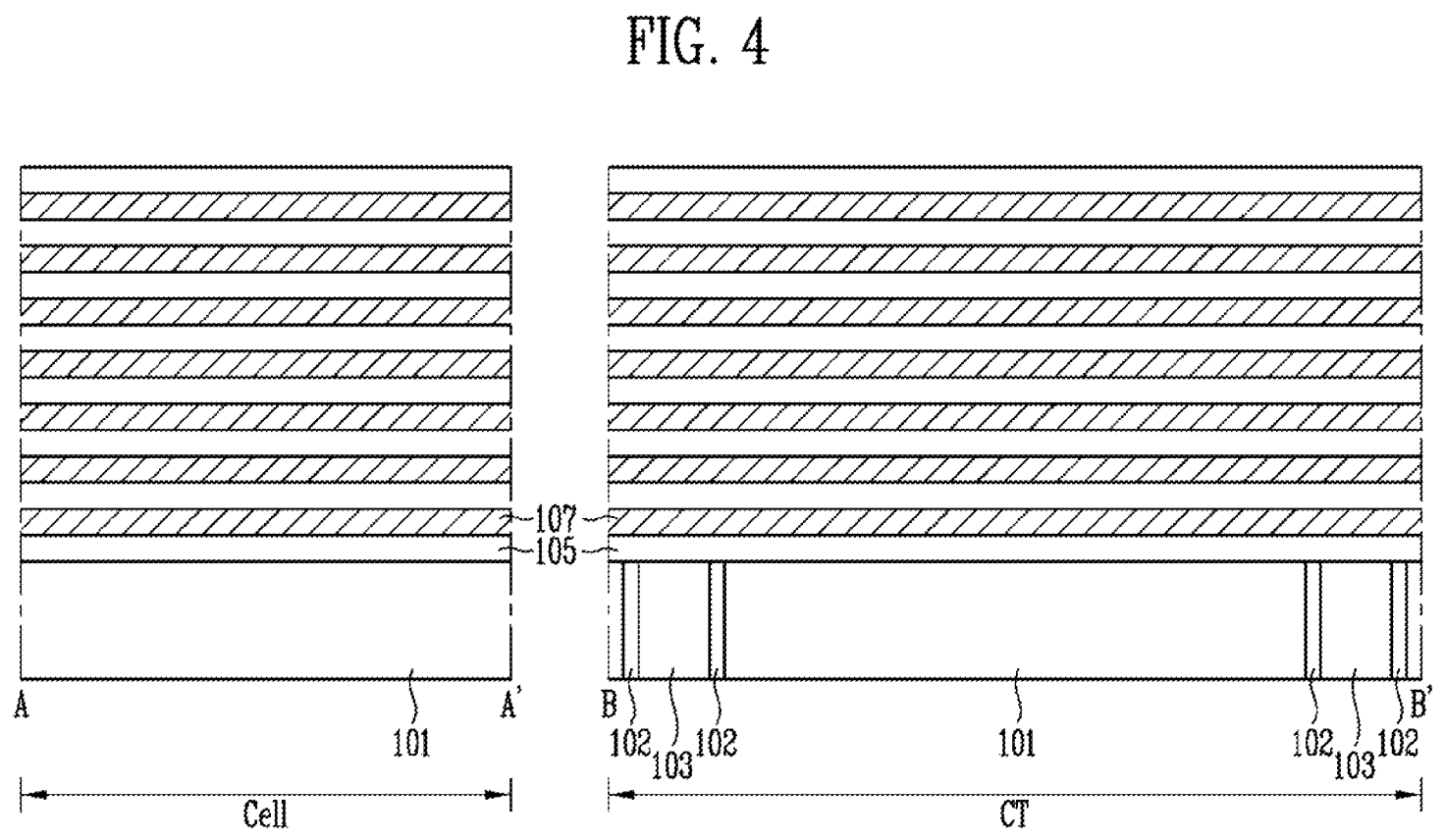

Referring to FIG. 4, the source line layer 101 is formed on the cell region Cell and the contact region CT of the semiconductor device. The source line layer 101 may be a doped semiconductor layer, for example, a semiconductor layer doped with an n-type impurity. As an embodiment, the source line layer 101 may be formed by implanting an impurity into the surface of the substrate SUB shown in FIG. 1A or by depositing at least one doped silicon layer on the substrate SUB. As an embodiment, the source line layer 101 may be formed by forming an insulating layer on the peripheral circuit structure PC shown in FIG. 1B and then depositing at least one doped silicon layer on the insulating layer.

Thereafter, a portion of the source line layer 101 formed on the contact region CT is etched to form a region in which the contact pad layer is to be formed. The region in which the contact pad layer is to be formed may be defined as a region electrically connected to the peripheral circuit structure PC shown in FIGS. 1A and 1B. Thereafter, the contact pad layer 103 is formed in a portion where the source line layer 101 is etched and removed. The isolation layer 102 is formed between the contact pad layer 103 and the source line layer 101 to electrically separate the contact pad layer 103 and the source line layer 101. The isolation layer 102 may be formed of an insulating layer, for example, an oxide layer.

Thereafter, the stack 105 and 107 in which first material layers 105 and second material layers 107 are alternately stacked are formed on the cell region Cell and the contact region CT. The second material layers 107 may be for forming conductive layers such as a word line, a select line, and a pad, and the first material layers 105 may be for insulating the stacked conductive layers from each other.

The first material layers 105 are formed of a material having a high etching selectivity with respect to the second material layers 107. For example, the first material layers 105 may include an insulating material such as oxide, and the second material layers 107 may include a sacrificial material such as nitride.

Figure 5A:
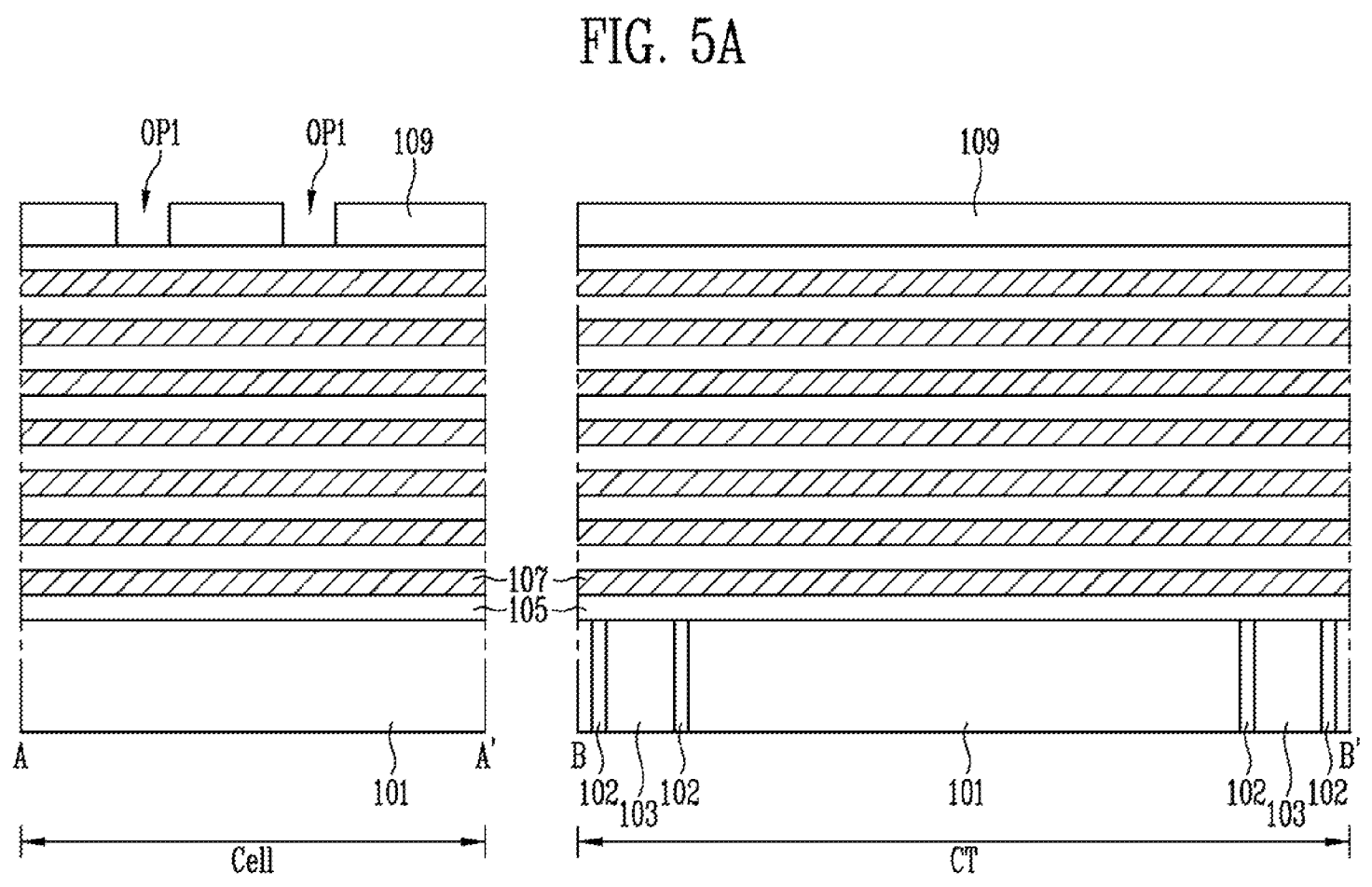
Figure 5B:
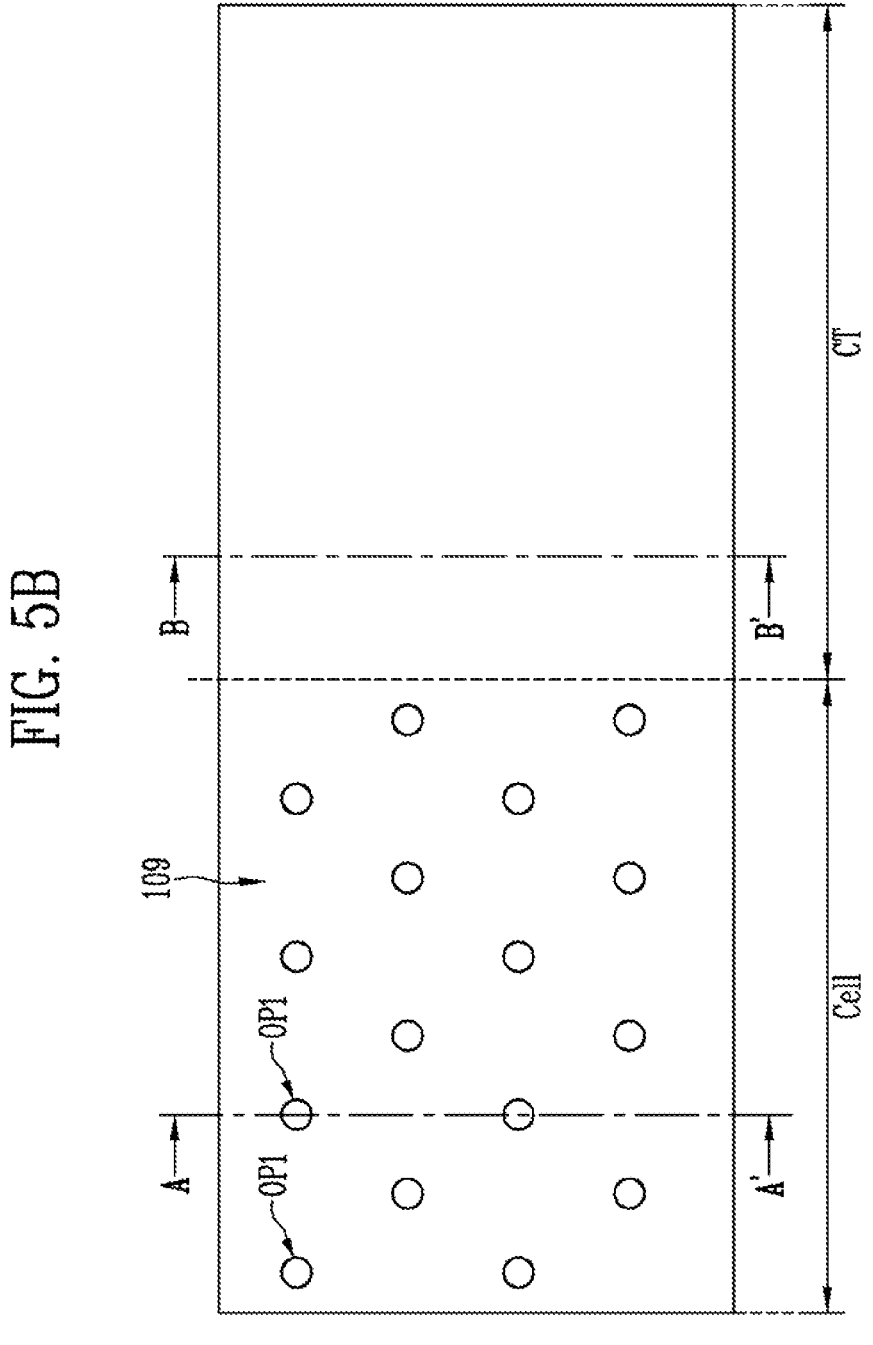

Referring to FIGS. 5A and 5B, a first mask pattern 109 is formed on the stack 105 and 107 of the cell region Cell and the contact region CT. The first mask pattern 109 is formed so that a portion where the channel plug is to be formed in the cell region Cell has a first opening OP1.

Figure 6A:
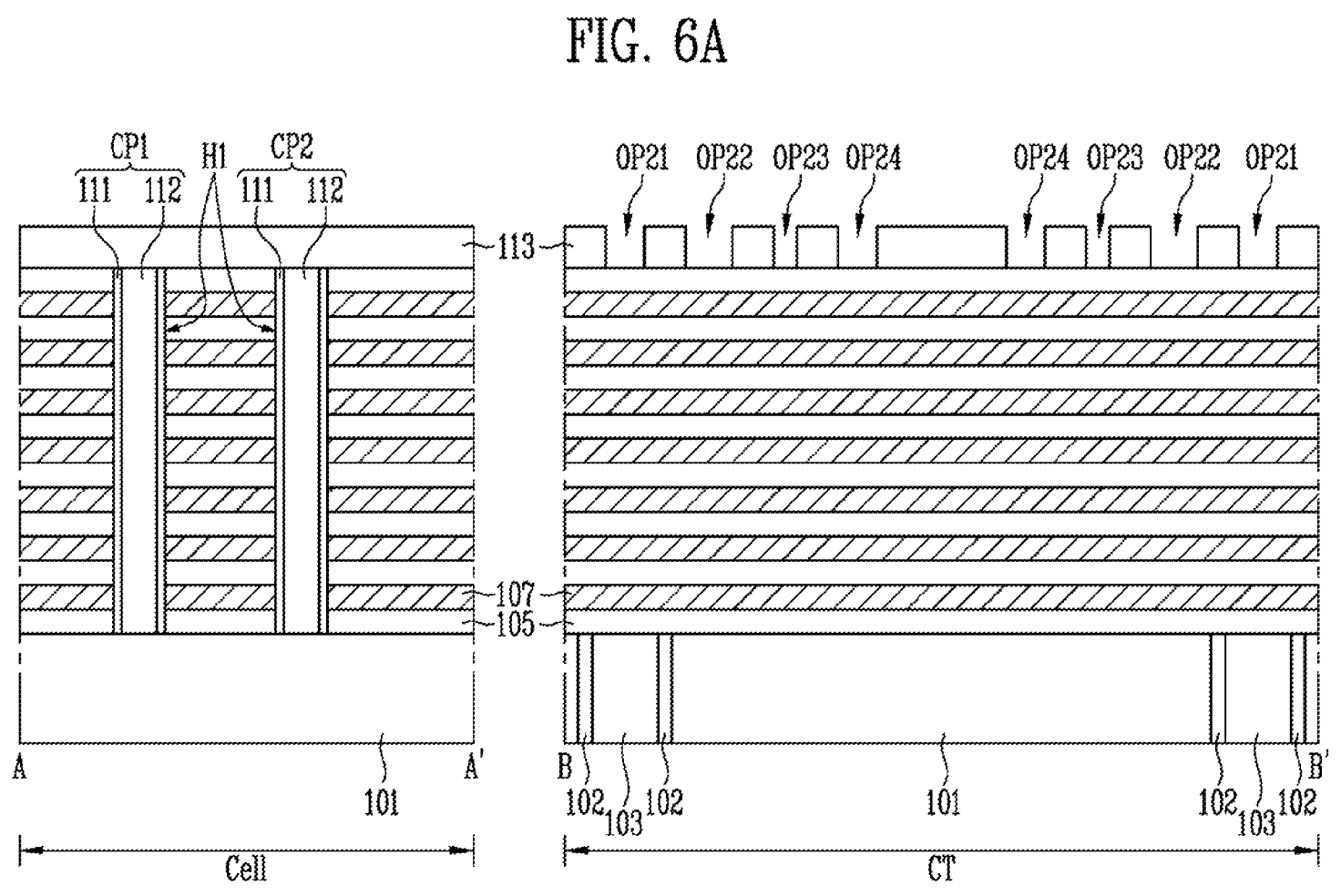
Figure 6B:
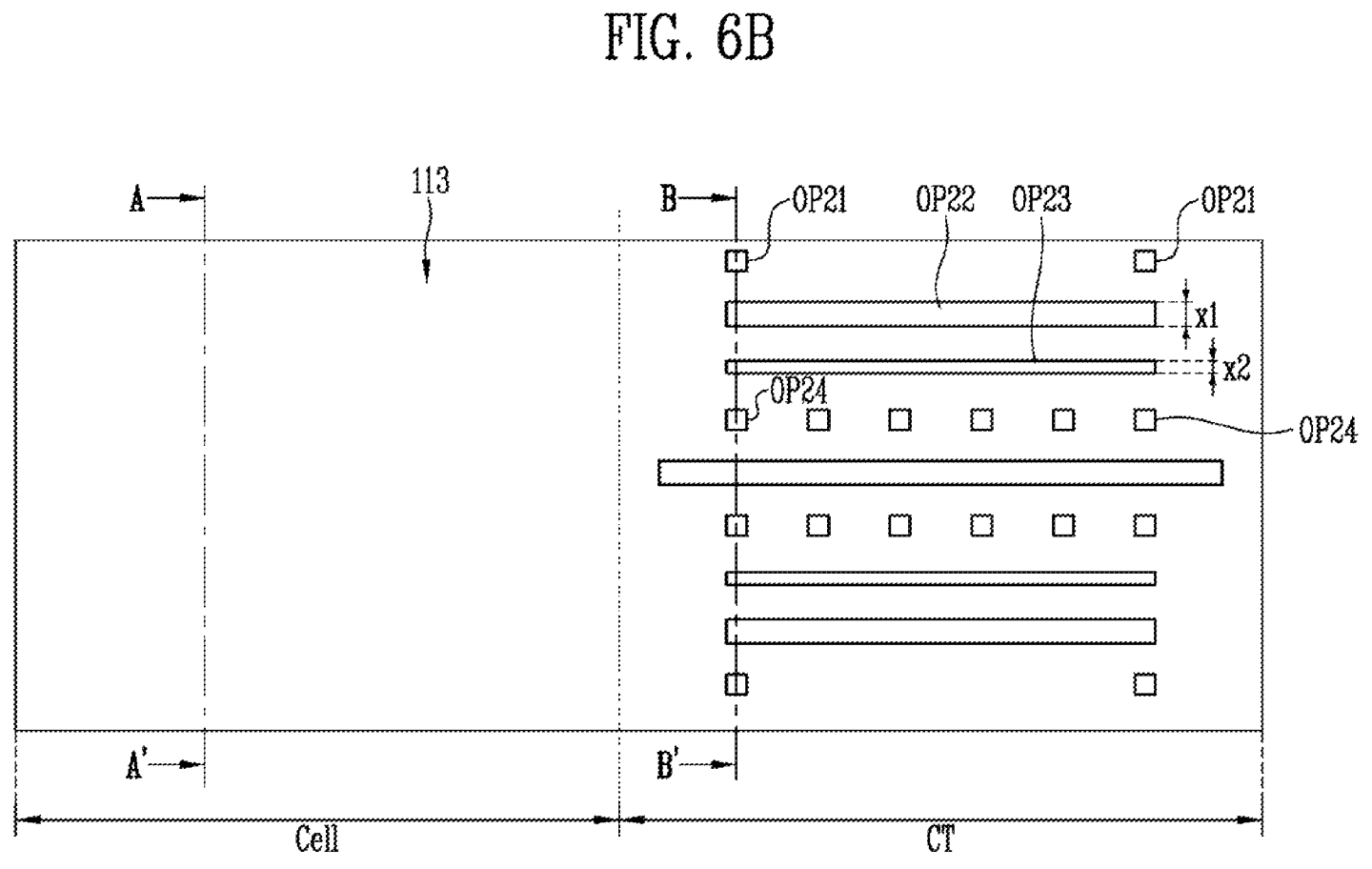

Referring to FIGS. 6A and 6B, the stack 105 and 107 is etched due to using the first mask pattern as a barrier to form first holes H1 passing through a portion or an entirety of the stack 105 and 107. At this time, the contact region CT is not etched by the first mask pattern, and thus a hole is not formed.

Thereafter, the first mask pattern is removed.

Thereafter, the channel plugs CP1 and CP2 including the channel layer 112 and the memory layer surrounding the channel layer 112 are formed in the first holes H1. For example, the memory layer 111 is formed on a sidewall of the first holes H1. The memory layer 111 may include at least one of a charge blocking layer, a data storage layer, and a tunnel insulating layer, and the data storage layer may include a floating gate such as silicon, a charge trap material such as nitride, a phase change material, a nano dot, or the like. Thereafter, the channel plugs CP1 and CP2 are formed by completely filling the first holes H1 with the channel layer 112 up to a central region. As another embodiment, the channel layer 112 may be formed in a structure in which the central region of the first holes H1 is open, and a gap-fill layer may be formed in the opened central region.

Thereafter, a second mask pattern 113 is formed on the channel plugs CP1 and CP2 and the stack 105 and 107 of the cell region Cell and on the stack 105 and 107 of the contact region CT. The second mask pattern 113 is formed so that a portion where the contact plug is to be formed and a portion where the support structure is to be formed in the contact region CT have second openings OP21 to OP24. For example, the second opening OP21 corresponding to the contact plug may have a hole type, and the second openings OP22 and OP23 corresponding to the support structure may have a line type. Widths X1 and X2 of the second openings OP22 and OP23 of the line type may be different from each other.

In an embodiment of the present disclosure, an example in which the support structure is formed in the line shape and the hole type of a quadrangle structure is described, but the present disclosure is not limited thereto, and the support structure may be formed in various patterns such as a circle, an ellipse, a rhombus, and the like.

Figure 7:
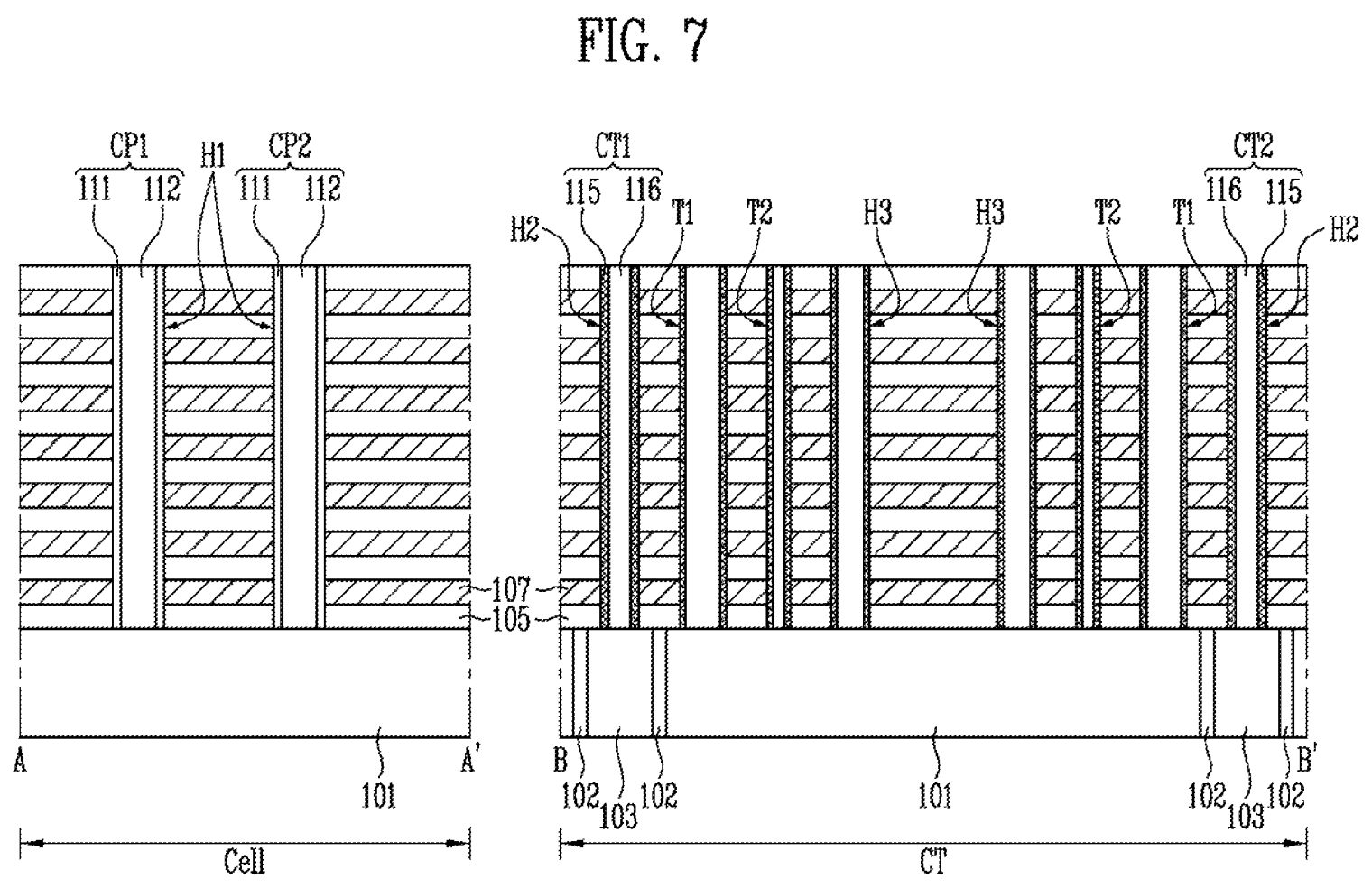

Referring to FIG. 7, the stack 105 and 107 on the contact region CT are etched using a second mask pattern as a barrier to form second holes H2 and third holes H3 passing through a portion or an entirety of the stack 105 and 107 and first and second trenches T1 and T2 of a line shape. At this time, the cell region Cell is prevented or mitigated from being etched by the second mask pattern. Widths of the first and second trenches T1 and T2 may be different from each other.

Thereafter, the second mask pattern may be removed.

Thereafter, a barrier layer 115 is formed on a sidewall of the second holes H2, and the contact plugs CT1 and CT2 connected to the contact pad layer 103 are formed by filling an inside of the second holes H2 with the conductive layer 116 for a contact plug. At this time, the barrier layer 115 and the conductive layer 116 for the contact plug may be formed inside the third holes H3 and the first and second trenches T1 and T2 of the line shape.

Figure 8A:
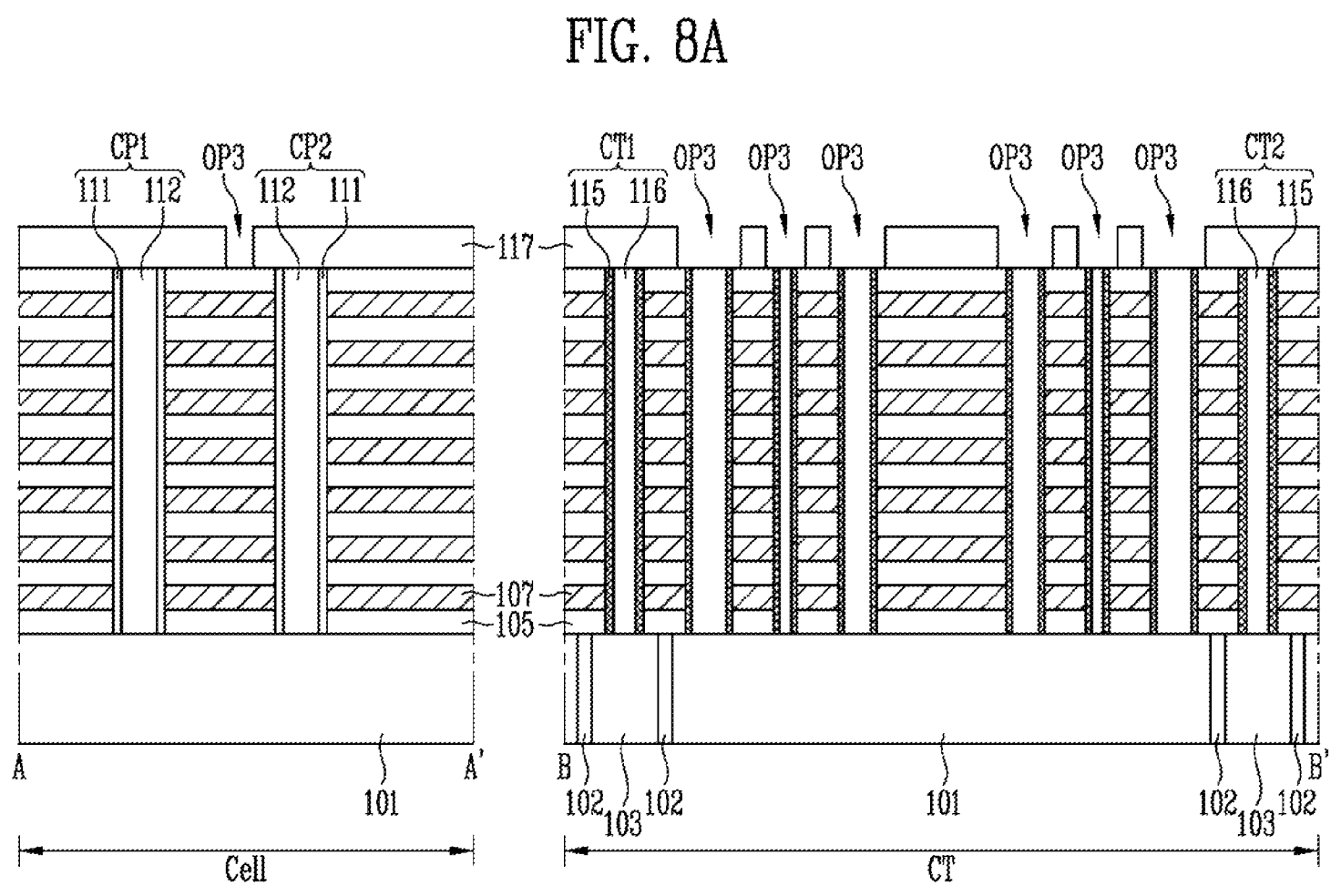
Figure 8B:
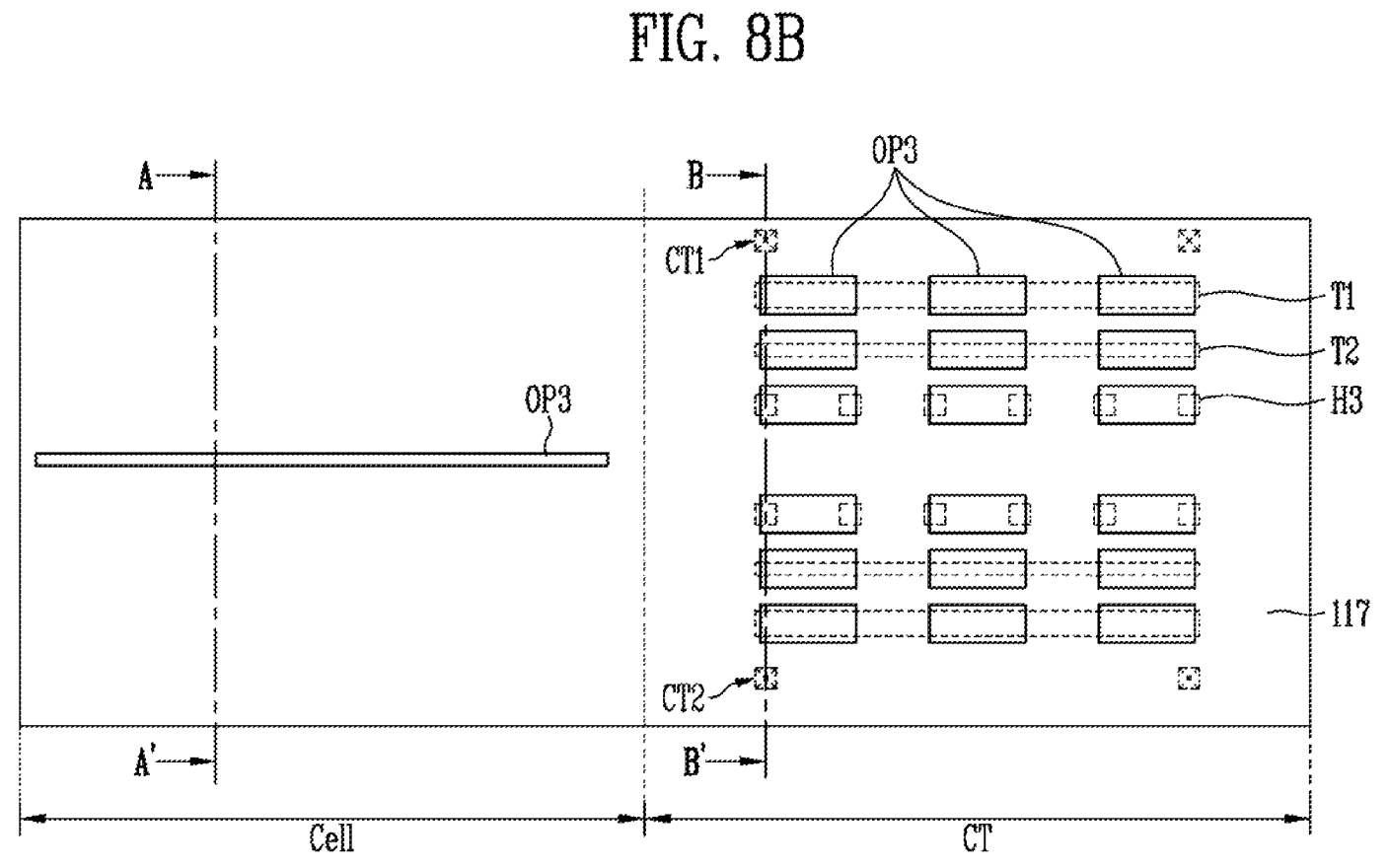

Referring to FIGS. 8A and 8B, the auxiliary support structure 117 is formed on the channel plugs CP1 and CP2 and the stack 105 and 107 of the cell region Cell, and the contact plugs CT1 and CT2 and the stack 105 and 107 of the contact region CT. The auxiliary support structure 117 may be used as a third mask pattern for forming the first vertical structure. The auxiliary support structure 117 is formed to have a third opening OP3 in which a partial region is opened among a region between the channel plugs CP1 and CP2 in the cell region Cell and a region where the support structure of the contact region CT is to be formed. That is, the auxiliary support structure 117 is formed to have the third opening OP3 through which the region where the first vertical structure between the channel plugs CP1 and CP2 is to be formed and a portion of the region where the support structure is to be formed are opened. The third opening OP3 of the region where the first vertical structure is to be formed may be formed in a line shape as shown in FIG. 8B.

The auxiliary support structure 117 formed on the contact region CT may be formed in a mesh structure. That is, the third openings OP3 on the contact region CT may be disposed in a matrix structure. Each of the third openings OP3 on the contact region CT may have a dash type. Each of the third openings OP3 on the contact region CT may be disposed to overlap the first trench T1 where the first support structure is to be formed, the second trench T2 where the second support structure is to be formed, and the third hole H3 where the third support structure is to be formed. At least one of the third openings OP3 on the contact region CT may be disposed to overlap a portion or the entire of the first trench T1, at least one of the third openings OP3 on the contact region CT may be disposed to overlap a portion or the entire of the second trench T2, and at least one of the third openings OP3 on the contact region CT may be disposed to overlap a portion or the entire of at least one of the plurality of third holes H3. That is, at least one third hole H3 may overlap one third opening OP3.

Figure 9:
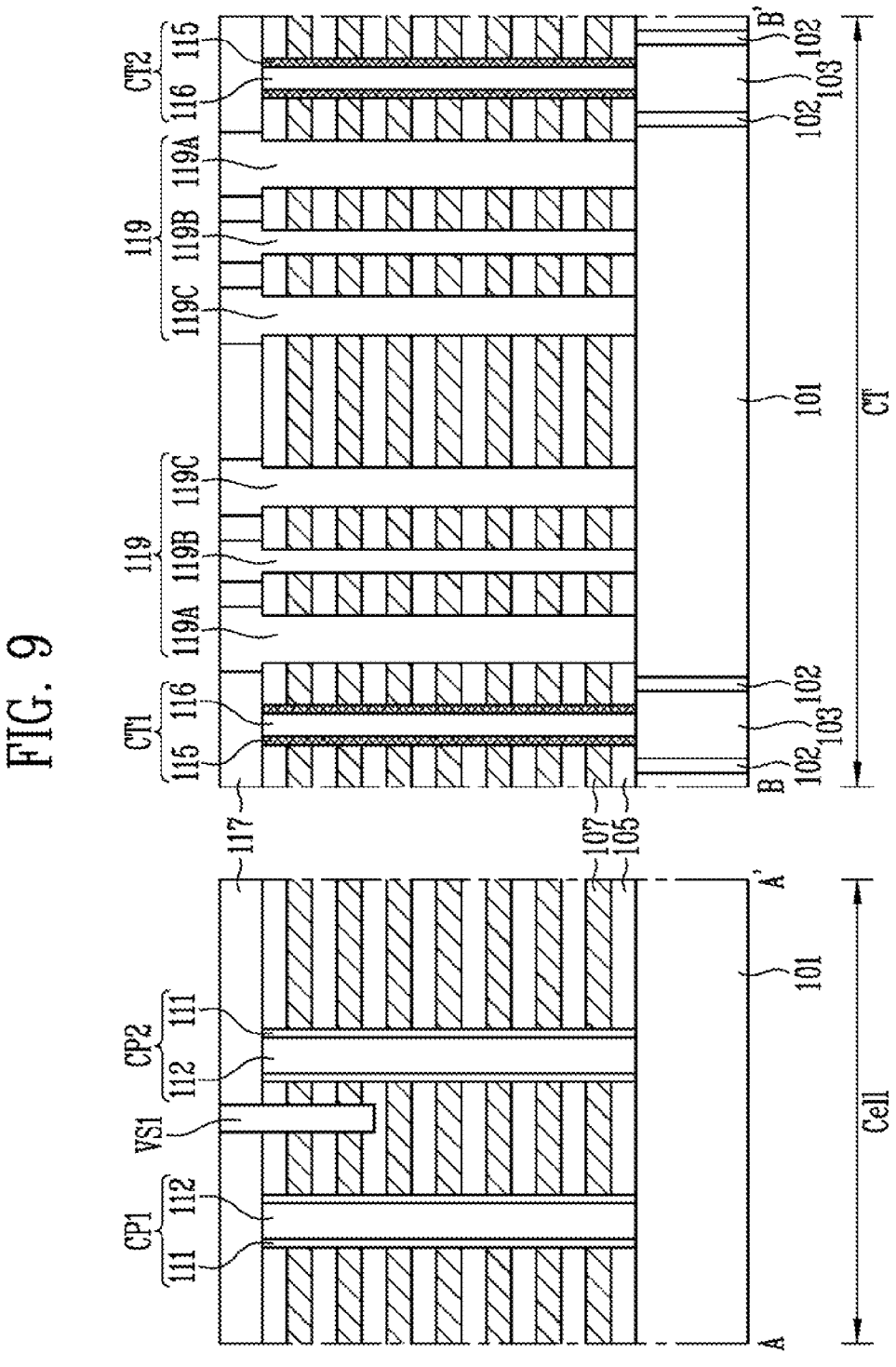

Referring to FIG. 9, a portion of an upper end of the stack 105 and 107 formed between the channel plugs CP1 and CP2 of the cell region Cell is etched using the auxiliary support structure 117 as a mask pattern to form a first slit, and an insulating layer is filled in the first slit to form the first vertical structure VS1. The first vertical structure VS1 is formed to pass through at least one second material layer 107 disposed at the uppermost end of the stack 105 and 107 where the drain select line is to be formed.

Thereafter, in the contact region CT, the conductive layer 116 for the contact plug and the barrier layer 115 formed in the first trench, the second trench, and the third hole exposed through the third opening OP3 of FIGS. 8A and 8B of the auxiliary support structure 117 are removed. Thereafter, an insulating layer is filled in the first trench, the second trench, and the third hole to form the first support structure 119A, the second support structure 119B, and the third support structures 119C.

A process of removing the conductive layer 116 for the contact plug and the barrier layer 115 described above may be performed after an etching process for forming the first slit in the cell region Cell using the auxiliary support structure 117 as a mask pattern. In addition, a process of filling the insulating layer in the first trench, the second trench, and the third hole may be performed together with a process of filling the insulating layer in the first slit. The first vertical structure VS1 and the supporting structures 119 may be formed of an oxide layer.

Figure 10A:
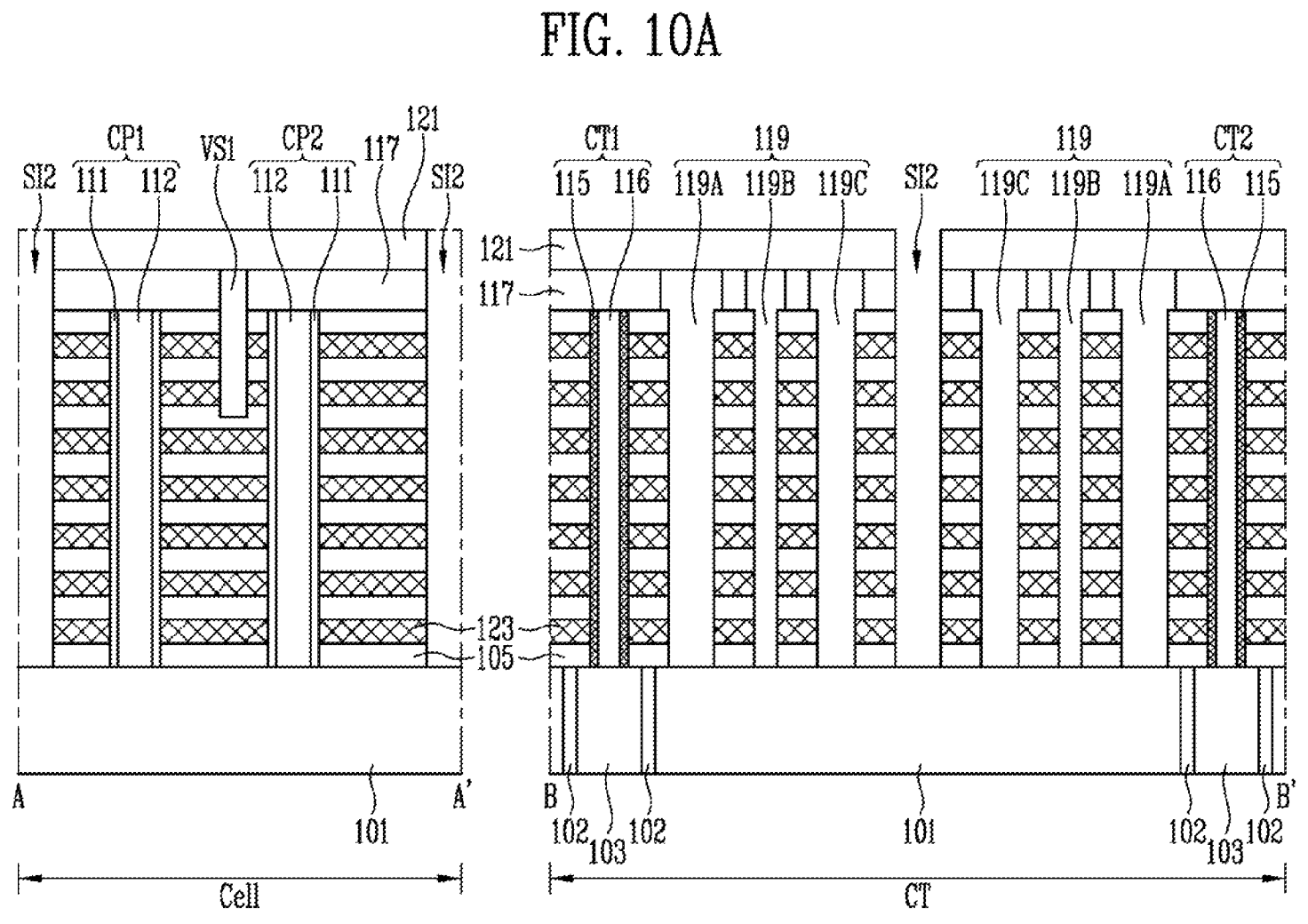
Figure 10B:
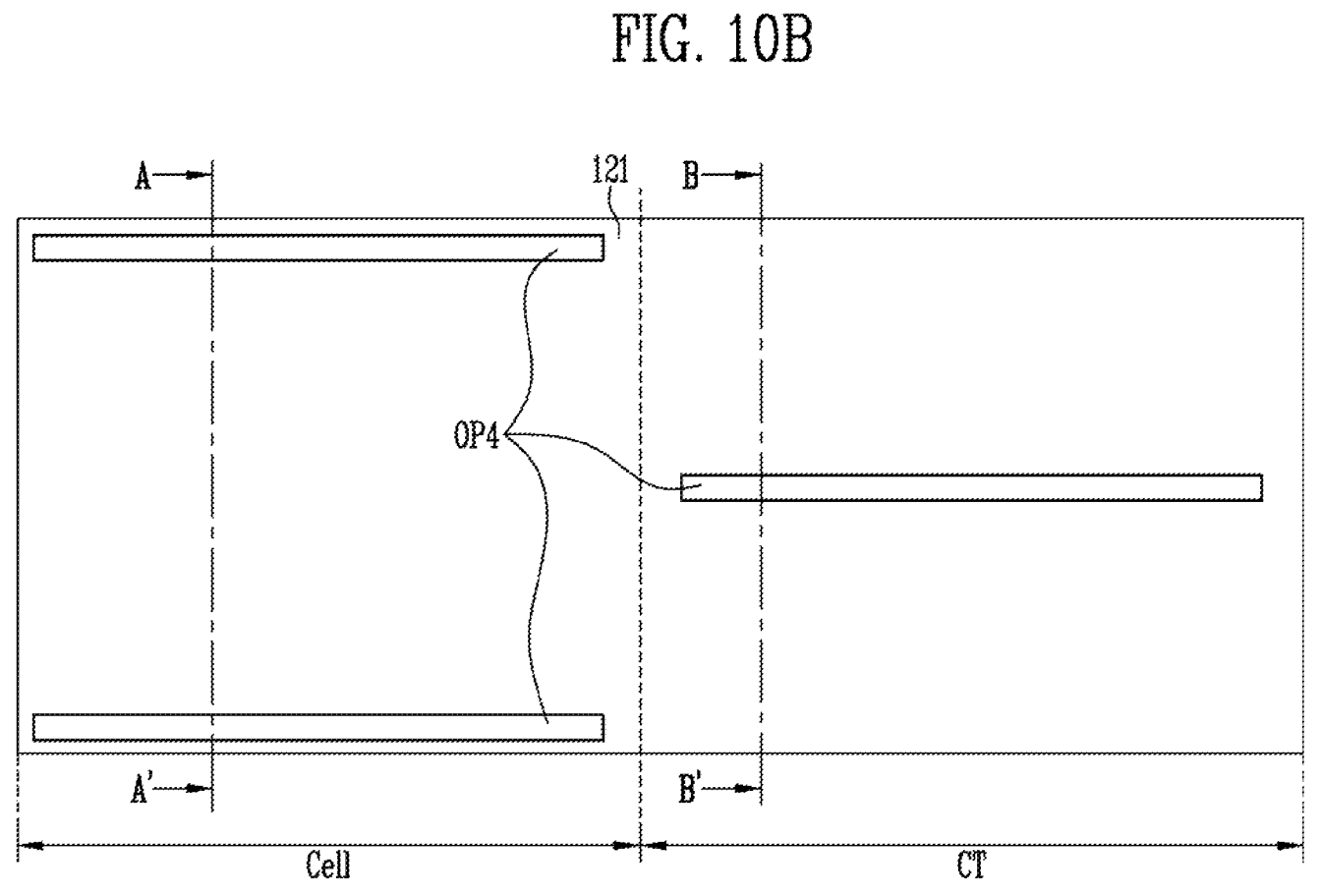

Referring to FIGS. 10A and 10B, a fourth mask pattern 121 is formed on the auxiliary support structure 117 on the cell region Cell and the contact region CT. The fourth mask pattern 121 is formed to have a fourth opening OP4 through which both ends of a region where the channel plugs CP1 and CP2 are disposed in the cell region Cell and a region between the support structures 119 of the contact region CT are opened. That is, the fourth mask pattern 121 is formed to have the fourth opening OP4 through which a region where the second vertical structure is to be formed at both ends of the region where the channel plugs CP1 and CP2 are disposed and a region where the second vertical structure is to be formed between the support structures 119 are opened. The fourth openings OP4 of the region where the second vertical structures are to be formed may be formed in a line shape as shown in FIG. 10B and may be disposed to be parallel to or perpendicular to each other. In addition, the fourth openings OP4 may be formed in various shapes according to an embodiment.

Thereafter, the auxiliary support structure 117 and the stack 105 and 107 of FIG. 9 formed at both ends of the region where the channel plugs CP1 and CP2 of the cell region Cell are disposed, and the auxiliary support structure 117 and the stack 105 and 107 of FIG. 9 formed between the support structures 119 of the contact region CT are etched to form second slits SI2. The second slits SI2 etch the stack 105 and 107 of FIG. 9 to expose a sidewall of the first material layer 105 and the second material layer 107 of FIG. 9.

Thereafter, the second material layers 107 of FIG. 9 of which the sidewall is exposed through the second slit SI2 are removed, and gate conductive layers 123 are formed in a space where the second material layers 107 of FIG. 9 are removed. At least one gate conductive layer 123 disposed at the lowermost end of the gate conductive layers 123 is a lower select line (source select line), at least one gate conductive layer 123 disposed at the uppermost end and separated by the first vertical structure VS1 is an upper select line (dram select line), and the remaining gate conductive layers 123 are word lines.

Figure 11:
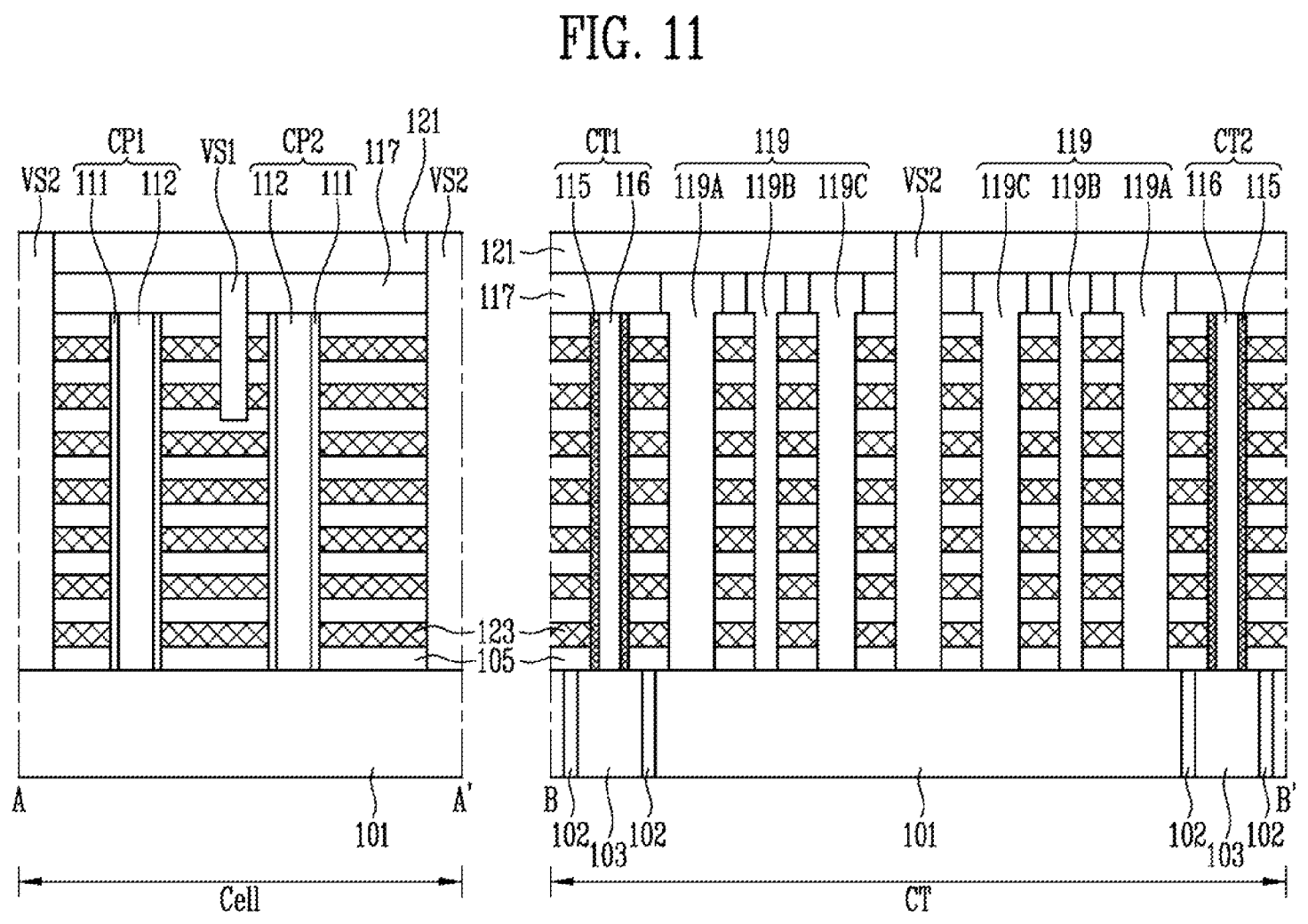

Referring to FIG. 11, the second vertical structures VS2 are formed by filling the second slits with an insulating layer. The second vertical structures VS2 may be formed of an oxide layer.

As described above, according to the method of manufacturing the semiconductor device according to an embodiment of the present disclosure, since the support structure 119 is formed of the same material as the first vertical structure VS1, that is, an oxide layer, a problem in that the support structure 119 is oxidized and expanded by heat generated during a subsequent process may be suppressed. In addition, by forming the support structure 119 in a line type and a hole type, problem in that the support structure 119 is inclined in one direction may be suppressed. In addition, in some embodiments, by forming the auxiliary support structure 117 on the support structure 119, the expansion of the upper portion of the support structure 119 may be suppressed.

Figure 12A:
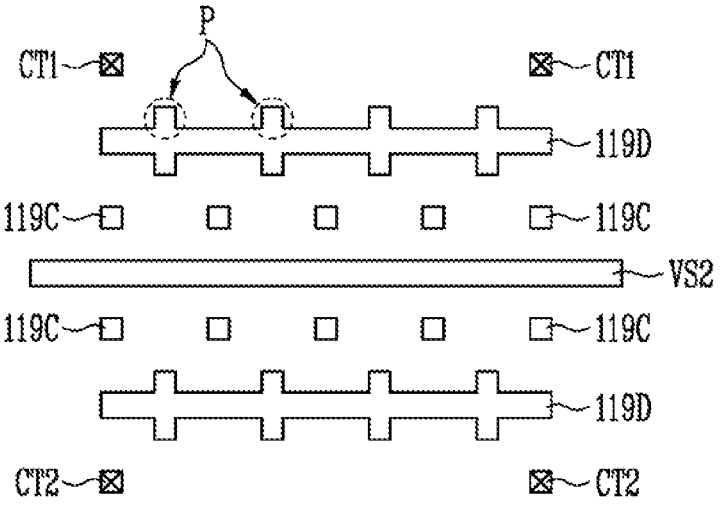
FIGS. 12A and 12B are plan views of a semiconductor device illustrating the semiconductor device according to another embodiment of the present disclosure.
Figure 12B:
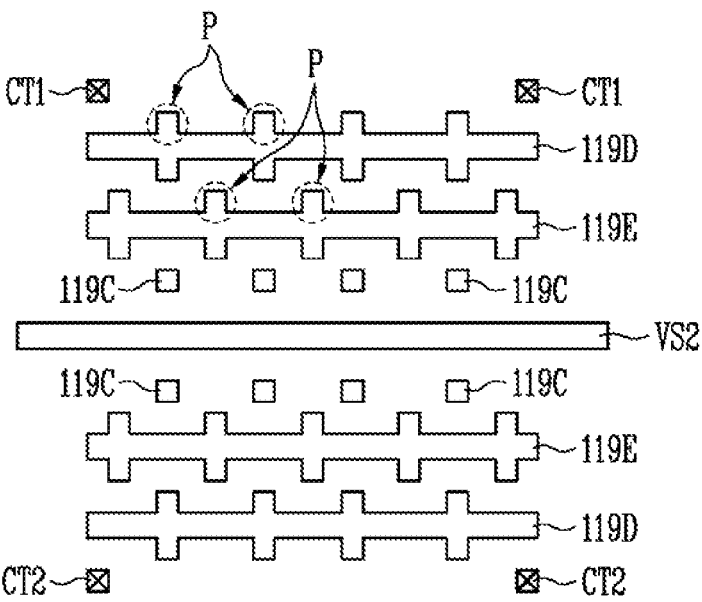

FIGS. 12A and 12B are plan views of a semiconductor device illustrating the semiconductor device according to another embodiment of the present disclosure.

Referring to FIG. 12A, a support structure 119D of a line shape including protrusions P and a support structure 119C of a hole type may be disposed. In an embodiment, the support structure 119D of the line shape including the protrusions P may suppress an expansion of an insulating layer configuring the support structure 119D in one direction due to heat. In addition, the support structures 119C of the hole type may be disposed in a row adjacent to the second vertical structure VS2 as shown in the drawing, and additionally may be disposed in the space between the contact plugs (that is, between the contact plugs CT1 and CT1 and between the contact plugs CT2 and CT2).

In addition, as another embodiment, the support structures 119C of the hole type may be formed and disposed in various shapes other than a quadrangle shape, for example, a circle shape, an ellipse shape, and a cross shape (+).

Referring to FIG. 12B, support structures 119D and 119E of a line shape including protrusions P may be disposed adjacently. At this time, the protrusions P of each of the adjacent support structures 119D and 119E of the line shape may be disposed so as not to face each other.

Figure 13:
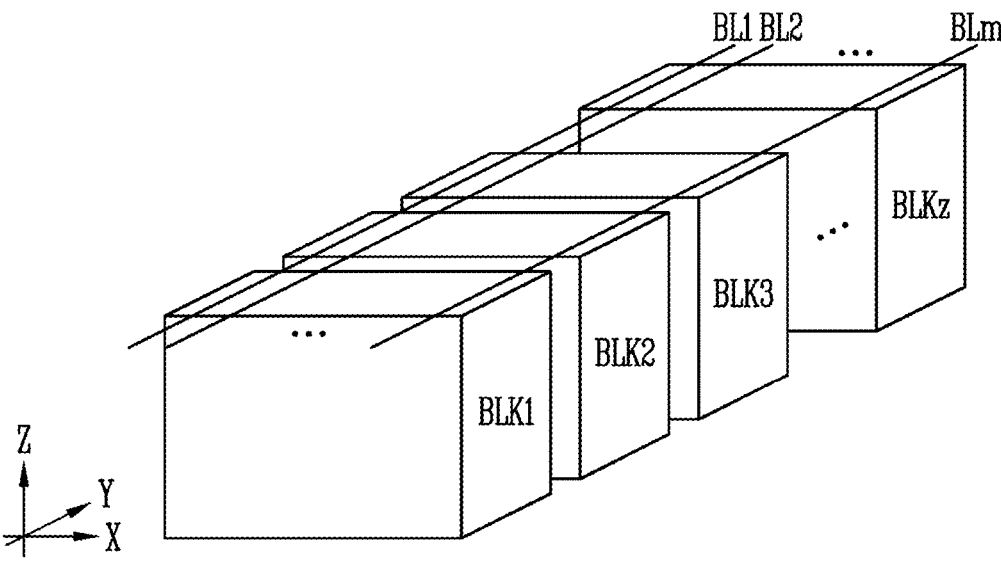
FIG. 13 is a diagram illustrating memory blocks included in a semiconductor device according to an embodiment of the present disclosure.

FIG. 13 is a diagram illustrating memory blocks included in a semiconductor device according to an embodiment of the present disclosure.

The semiconductor device may include a plurality of memory blocks BLK1 to BLKz. The memory blocks BLK1 to BLKz may be arranged to be spaced apart from each other along a direction Y in which bit lines BLK to BLM extend. For example, the first to z-th memory blocks BLK1 to BLKz may be arranged to be spaced apart from each other along a second direction Y, and may include a plurality of memory cells stacked along a third direction Z. At this time, the first to z-th memory blocks BLK1 to BLKz may be spaced apart from each other using a slit.

Each of the plurality of memory blocks BLK1 to BLKz may include the plurality of channel plugs, the contact plugs, and the support structures as shown in FIGS. 3A and 3B or 12A and 12B.

Figure 14:
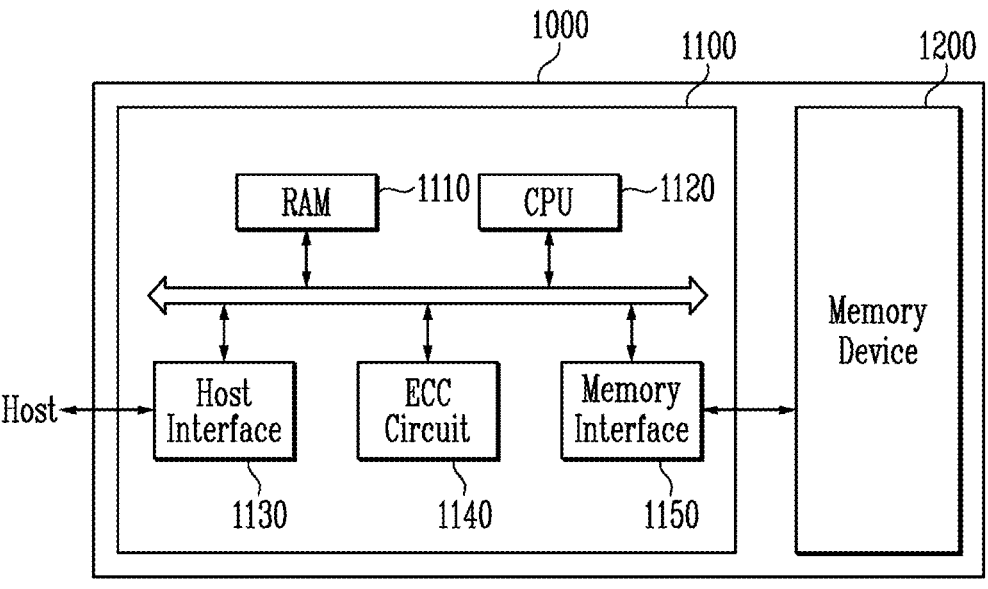
FIG. 14 is a block diagram illustrating a configuration of a memory system according to an embodiment of the present disclosure.

FIG. 14 is a block diagram illustrating a configuration of a memory system according to an embodiment of the present disclosure.

Referring to FIG. 14, the memory system 1000 according to an embodiment of the present disclosure includes a memory device 1200 and a controller 1100.

The memory device 1200 is used to store data information having various data types such as a text, a graphic, and a software code. The memory device 1200 may be the semiconductor device described with reference to FIG. 1A, 1B, 2, 3A to 3D, 12A, or 12B, and may be manufactured according to the manufacturing method described with reference to FIGS. 4 to 11. Since a structure of the memory device 1200 and a method of manufacturing the memory device 1200 are the same as described above, a detailed description thereof will be omitted.

The controller 1100 is connected to a host and the memory device 1200 and is configured to access the memory device 1200 in response to a request from the host. For example, the controller 1100 is configured to control read, write, erase, and background operations, and the like of the memory device 1200.

The controller 1100 includes a random access memory (RAM) 1110, a central processing unit (CPU) 1120, a host interface 1130, an error correction code circuit 1140, a memory interface 1150, and the like.

Here, the RAM 1110 may be used as an operation memory of the CPU 1120, a cache memory between the memory device 1200 and the host, a buffer memory between the memory device 1200 and the host, and the like. For reference, the RAM 1110 may be replaced with a static random access memory (SRAM), a read only memory (ROM), or the like.

The CPU 1120 is configured to control overall operation of the controller 1100. For example, the CPU 1120 is configured to operate firmware such as a flash translation layer (FTL) stored in the RAM 1110.

The host interface 1130 is configured to perform interfacing with the host. For example, the controller 1100 communicates with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The ECC circuit 1140 is configured to detect and correct an error included in data read from the memory device 1200 using an error correction code (ECC).

The memory interface 1150 is configured to perform interfacing with the memory device 1200. For example, the memory interface 1150 includes a NAND interface or a NOR interface.

For reference, the controller 1100 may further include a buffer memory (not shown) for temporarily storing data. Here, the buffer memory may be used to temporarily store data transferred to the outside through the host interface 1130, or to temporarily store data transferred from the memory device 1200 through the memory interface 1150. In addition, the controller 1100 may further include a ROM that stores code data for interfacing with the host.

As described above, since the memory system 1000 according to an embodiment of the present disclosure includes the memory device 1200 having an improved degree of integration and an improved characteristic, a degree of integration and a characteristic of the memory system 1000 may also be improved.

Figure 15:
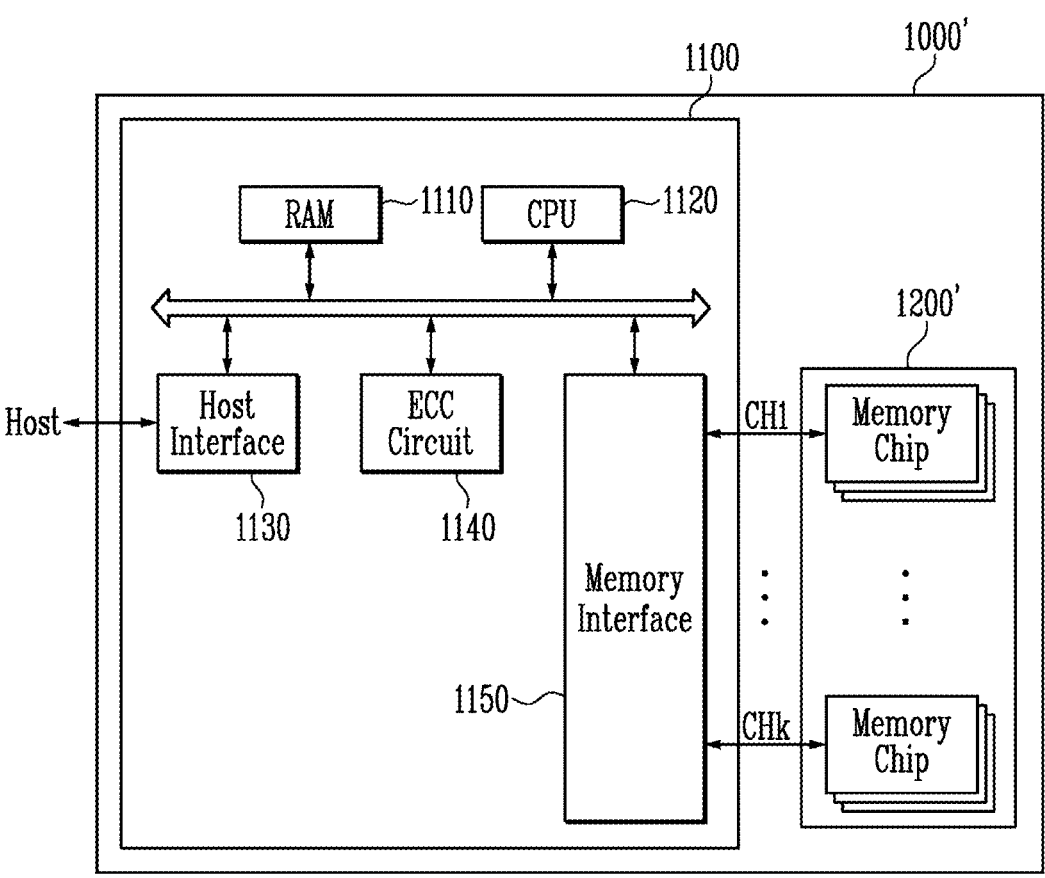
FIG. 15 is a block diagram illustrating a configuration of a memory system according to an embodiment of the present disclosure.

FIG. 15 is a block diagram illustrating a configuration of a memory system according to an embodiment of the present disclosure. Hereinafter, descriptions repetitive to the above description will be omitted.

Referring to FIG. 15, the memory system 1000' according to an embodiment of the present disclosure includes a memory device 1200' and a controller 1100. In addition, the controller 1100 includes a RAM 1110, a CPU 1120, a host interface 1130, an ECC circuit 1140, a memory interface 1150, and the like.

The memory device 1200' may be a nonvolatile memory. The memory device 1200' may be the semiconductor device described above with reference to FIG. 1A, 1B, 2, 3A to 3D, 12A, or 12B, and may be manufactured according to the manufacturing method described with reference to FIGS. 4 to 11. Since a structure of the memory device 1200' and a method of manufacturing the memory device 1200' are the same as described above, a detailed description thereof will be omitted.

In addition, the memory device 1200' may be a multi-chip package configured of a plurality of memory chips. The plurality of memory chips are divided into a plurality of groups, and the plurality of groups are configured to communicate with the controller 1100 through first to k-th channels CH1 to CHk. In addition, the memory chips belonging to one group are configured to communicate with the controller 1100 through a common channel. For reference, the memory system 1000' may be modified such that one memory chip is connected to one channel.

As described above, since the memory system 1000' according to an embodiment of the present disclosure includes the memory device 1200' having an improved degree of integration and an improved characteristic, a degree of integration and a characteristic of the memory system 1000' may also be improved. In particular, by configuring the memory device 1200' in a multi-chip package, data storage capacity of the memory system 1000' may be increased and a driving speed may be improved.

Figure 16:
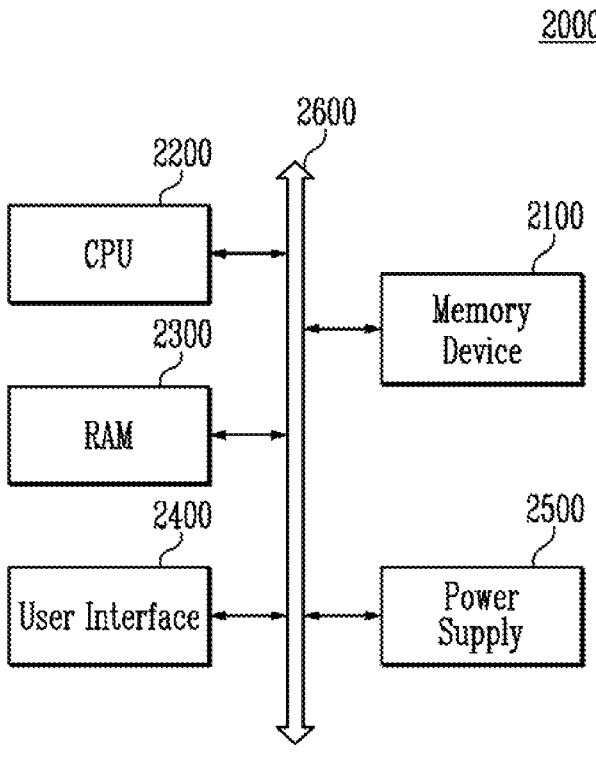
FIG. 16 is a block diagram illustrating a configuration of a computing system according to an embodiment of the present disclosure.

FIG. 16 is a block diagram illustrating a configuration of a computing system according to an embodiment of the present disclosure. Hereinafter, descriptions repetitive to the above description will be omitted.

Referring to FIG. 16, the computing system 2000 according to an embodiment of the present disclosure includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or may be directly connected to the system bus 2600. When the memory device 2100 is directly connected to the system bus 2600, a function of the controller may be performed by the CPU 2200, the RAM 2300, and the like.

Here, the memory device 2100 may be a nonvolatile memory. The memory device 2100 may be the semiconductor device described above with reference to FIG. 1A, 1B, 2, 3A to 3D, 12A, or 12B, and may be manufactured according to the manufacturing method described with reference to FIGS. 4 to 11. Since a structure of the memory device 2100 and a method of manufacturing the memory device 2100 are the same as described above, a detailed description thereof will be omitted.

In addition, the memory device 2100 may be a multi-chip package including a plurality of memory chips as described with reference to FIG. 15.

The computing system having such a configuration may be a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or the like.

As described above, since the computing system 2000 according to an embodiment of the present disclosure includes the memory device 2100 having an improved degree of integration and an improved characteristic, a characteristic of the computing system 2000 may also be improved.

Figure 17:
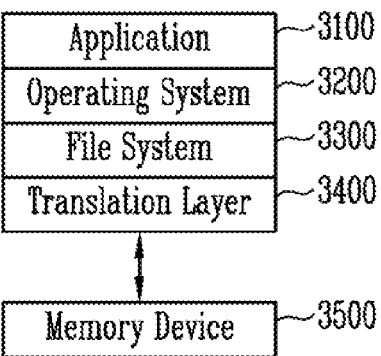
FIG. 17 is a block diagram illustrating a computing system according to an embodiment of the present disclosure.

FIG. 17 is a block diagram illustrating a computing system according to an embodiment of the present disclosure.

Referring to FIG. 17, the computing system 3000 according to an embodiment of the present disclosure includes a software layer including an operating system 3200, an application 3100, a file system 3300, a translation layer 3400, and the like. In addition, the computing system 3000 includes a hardware layer such as a memory device 3500.

The operating system 3200 is for managing software, hardware resources, and the like of the computing system 3000, and may control program execution of a central processing unit. The application 3100 may be various application programs executed on the computing system 3000 and may be a utility that is executed by the operating system 3200.

The file system 3300 refers to a logical structure for managing data, a file, and the like existing in the computing system 3000, and organizes the file or data to be stored in the memory device 3500 according to a rule. The file system 3300 may be determined according to the operating system 3200 used in the computing system 3000. For example, when the operating system 3200 is a Windows system of Microsoft company, the file system 3300 may be a file allocation table (FAT), an NT file system (NTFS), or the like. In addition, when the operating system 3200 is a Unix/Linux system, the file system 3300 may be an extended file system (EXT), a Unix file system (UFS), a journaling file system (JFS), or the like.

Although the operating system 3200, the application 3100, and the file system 3300 are shown as separate blocks in the present figure, the application 3100 and the file system 3300 may be included in the operating system 3200.

The translation layer 3400 converts an address in a form suitable for the memory device 3500 in response to a request from the file system 3300. For example, the translation layer 3400 converts a logical address generated by the file system 3300 into a physical address of the memory device 3500. Here, mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. The memory device 3500 may be the semiconductor device described above with reference to FIG. 1A, 1B, 2, 3A to 3D, 12A, or 12B, and may be manufactured according to the manufacturing method described with reference to FIGS. 4 to 11. Since a structure of the memory device 3500 and a method of manufacturing the memory device 3500 are the same as described above, a detailed description thereof will be omitted.

The computing system 3000 having such a configuration may be divided into an operating system layer that is performed in a higher level region and a controller layer that is performed in a lower level region. Here, the application 3100, the operating system 3200, and the file system 3300 may be included in the operating system layer and may be driven by an operation memory of the computing system 3000, In addition, the translation layer 3400 may be included in the operating system layer or in the controller layer.

As described above, since the computing system 3000 according to an embodiment of the present disclosure includes the memory device 3500 having an improved degree of integration and an improved characteristic, a characteristic of the computing system 3000 may also be improved.

What is claimed is:

1. A semiconductor device comprising:
a stack structure including a plurality of interlayer insulating layers and a plurality of gate conductive layers that are alternately stacked;

a channel plug at least partially passing through the stack structure on a cell region; and
a plurality of support structures at least partially passing through the stack structure on a contact region, the plurality of support structures including a first support structure of a line type and a second support structure of a hole type; and
an auxiliary support structure formed on the stack structure, the first support structure, and the second support structure on the contact region,
wherein the auxiliary support structure includes a plurality of open regions,
wherein at least a portion of the plurality of open regions are spaced apart from each other in a first direction, and
wherein the first support structure overlaps at least two open regions spaced apart from each other in the first direction.

2. The semiconductor device of claim 1, wherein the plurality of open regions have a dash type.

3. The semiconductor device of claim 2, wherein the plurality of open regions are arranged in a matrix structure.

4. The semiconductor device of claim 1, wherein the auxiliary support structure has a mesh structure.

5. The semiconductor device of claim 1, further comprising:
a vertical structure of a line shape passing through an upper portion of the stack structure at a central portion of the cell region.

6. The semiconductor device of claim 5, wherein the auxiliary support structure extends to the cell region and has an open region overlapping with the vertical structure to expose a portion of the vertical structure.

7. The semiconductor device of claim 5, wherein the vertical structure passes through at least one gate conductive layer from the plurality of gate conductive layers that is a drain select line.

8. A semiconductor device comprising:
a stack structure including a plurality of interlayer insulating layers and a plurality of gate conductive layers that are alternately stacked;
first and second channel plugs formed on a cell region by vertically passing through a portion or an entirety of the stack structure;
a plurality of support structures formed on a contact region by vertically passing through at least a portion of the stack structure; and
an auxiliary support structure disposed on the stack structure and the plurality of support structures,
wherein the plurality of support structures include a first support structure of a line type,
wherein the auxiliary support structure includes a plurality of open regions which are spaced apart from each other in a first direction, and
wherein the first support structure overlaps at least two open regions spaced apart from each other in the first direction.

9. The semiconductor device of claim 8, wherein the plurality of support structures further include a second support structure of a hole type.

10. The semiconductor device of claim 8, wherein the auxiliary support structure is formed in a mesh structure including a plurality of open regions.

11. The semiconductor device of claim 10, wherein each of the plurality of open regions has a dash type.

12. The semiconductor device of claim 8, further comprising:

a vertical structure of a line shape passing through an upper portion of the stack structure at a central portion of the cell region.

13. The semiconductor device of claim 12, wherein the open regions expose the vertical structure.

* * * * *